(12) United States Patent
Nishimura

(10) Patent No.: US 10,439,061 B2
(45) Date of Patent: Oct. 8, 2019

(54) SEMICONDUCTOR DEVICE

(71) Applicant: FUJI ELECTRIC CO., LTD., Kawasaki-shi (JP)

(72) Inventor: Takeyoshi Nishimura, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 173 days.

(21) Appl. No.: 14/942,786

(22) Filed: Nov. 16, 2015

(65) Prior Publication Data

US 2016/0163854 A1  Jun. 9, 2016

(30) Foreign Application Priority Data

Dec. 8, 2014 (JP) ................................ 2014-248431

(51) Int. Cl.
*H01L 29/78* (2006.01)
*H01L 29/08* (2006.01)
(Continued)

(52) U.S. Cl.
CPC ...... *H01L 29/7813* (2013.01); *H01L 29/0696* (2013.01); *H01L 29/0865* (2013.01); *H01L 29/1095* (2013.01); *H01L 29/7802* (2013.01); *H01L 23/49562* (2013.01); *H01L 2224/05553* (2013.01); *H01L 2224/0603* (2013.01); *H01L 2224/48472* (2013.01)

(58) Field of Classification Search
CPC ............... H01L 29/783; H01L 29/7813; H01L 29/1095; H01L 29/0696; H01L 29/7802; H01L 29/0865; H01L 2224/48472; H01L 2224/0603; H01L 2224/05553; H01L 23/49562

See application file for complete search history.

(56) References Cited

U.S. PATENT DOCUMENTS 6,380,586 B1   4/2002 Yoshikawa
7,295,453 B2 * 11/2007 Shiraishi ............... H02M 7/003
                                                363/144

(Continued)

FOREIGN PATENT DOCUMENTS

JP    H05-63185 A    3/1993
JP    H05-63202 A    3/1993

(Continued)

*Primary Examiner* — Latanya N Crawford
(74) *Attorney, Agent, or Firm* — Rabin & Berdo, P.C.

(57) ABSTRACT

A front surface electrode common to a plurality of unit cells is provided substantially all over an active region of a semiconductor element. A plurality of electrode pads on the front surface electrode are closer to the outer peripheral portion side than the central portion of the active region. Different wires are joined to substantially the center of each electrode pad. The active region is divided into two or more segments so that the segments are aligned along the path of current flowing through the front surface electrode, and unit cells different in conduction ability are disposed respectively in each segment. Unit cells lowest in conduction ability are in the first segment farthest from junctions of the wires and electrode pads, and the unit cells are disposed so that the farther apart from the junctions of the wires and electrode pads, the lower in conduction ability the unit cells are.

18 Claims, 23 Drawing Sheets

(51) Int. Cl.
*H01L 29/10* (2006.01)
*H01L 29/06* (2006.01)
*H01L 23/495* (2006.01)

(56) References Cited

U.S. PATENT DOCUMENTS

| | | | |
|---|---|---|---|
| 9,123,701 B2* | 9/2015 | Otremba | H01L 23/48 |
| 2001/0054738 A1 | 12/2001 | Momota et al. | |
| 2006/0113664 A1* | 6/2006 | Shiraishi | H02M 7/003 |
| | | | 257/723 |
| 2009/0289277 A1 | 11/2009 | Yamaguchi | |
| 2012/0049290 A1* | 3/2012 | Shiraishi | H02M 7/003 |
| | | | 257/369 |
| 2014/0124890 A1* | 5/2014 | Fernando | H01L 23/34 |
| | | | 257/467 |
| 2014/0367737 A1 | 12/2014 | Takahashi et al. | |
| 2015/0014858 A1* | 1/2015 | Otremba | H01L 23/48 |
| | | | 257/774 |
| 2015/0221566 A1* | 8/2015 | Ookura | H01L 29/7397 |
| | | | 324/762.09 |
| 2016/0358869 A1 | 12/2016 | Godo et al. | |

FOREIGN PATENT DOCUMENTS

| | | |
|---|---|---|
| JP | 2000-228519 A | 8/2000 |
| JP | 2001-308327 A | 11/2001 |
| JP | 2004-111772 A | 4/2004 |
| JP | 2007-221012 A | 8/2007 |
| JP | 2009-289988 A | 12/2009 |
| JP | 2010-004003 A | 1/2010 |
| JP | 2014-241367 A | 12/2014 |
| WO | WO 2015-198435 A1 | 12/2015 |

\* cited by examiner

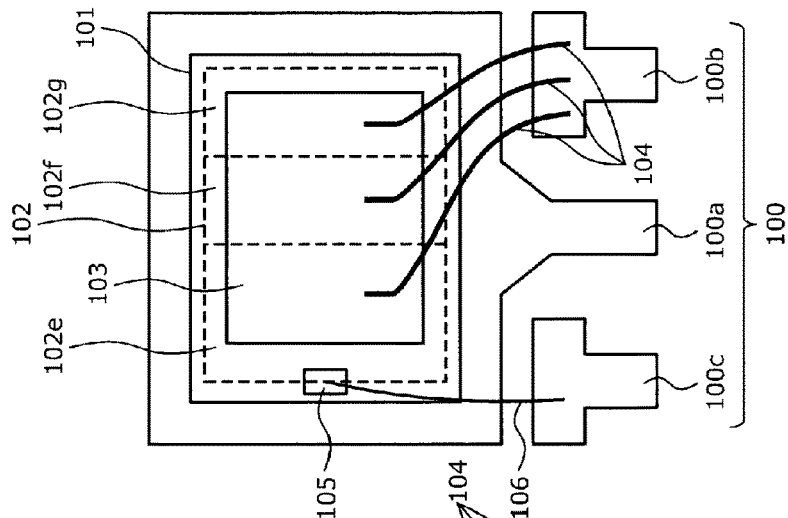
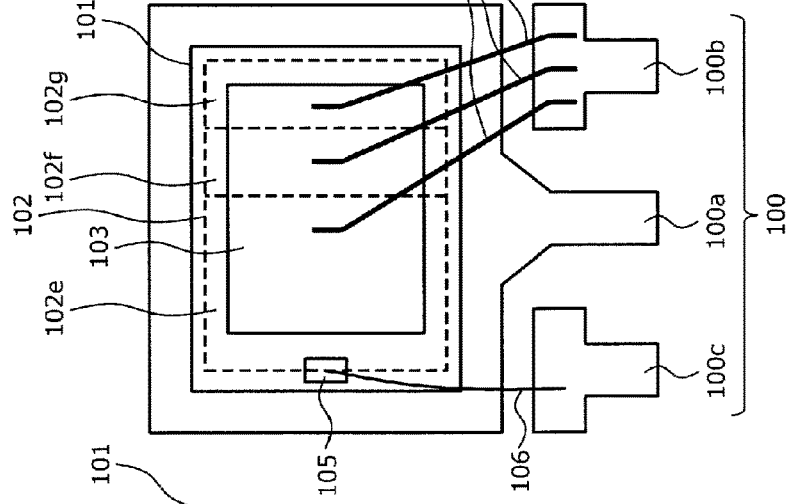
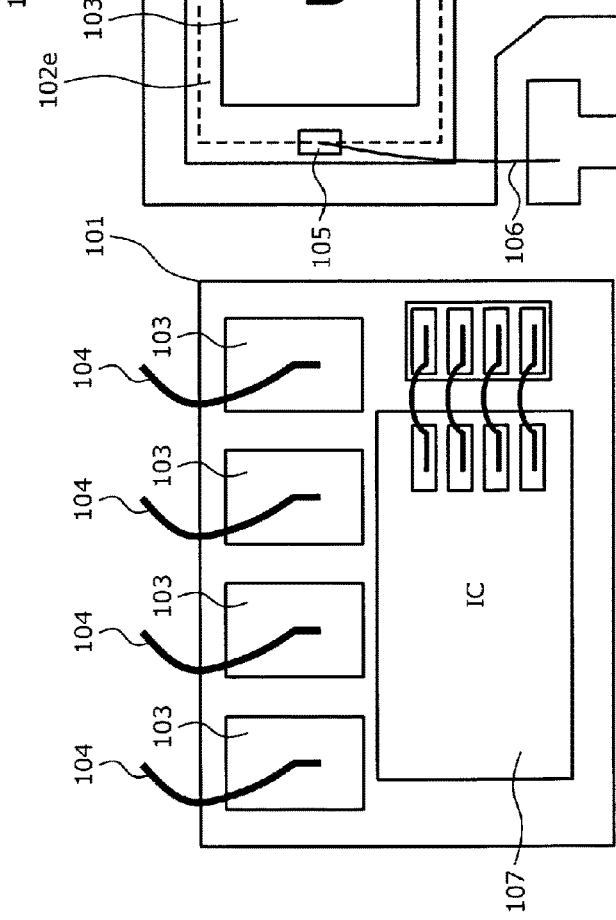

US 10,439,061 B2

SEMICONDUCTOR DEVICE

CROSS-REFERENCE TO RELATED APPLICATION

This application is based on, and claims priority to, Japanese Patent Application No. 2014-248431, filed on Dec. 8, 2014, contents of which are incorporated herein by reference.

BACKGROUND OF THE INVENTION

1. Field of the Invention

The present invention relates to a semiconductor device.

2. Description of the Background Art

Heretofore, a package type semiconductor device wherein a semiconductor element (a semiconductor chip) is mounted on an island portion on a lead frame, and an electrode pad on the semiconductor element and a lead portion on the lead frame are wire bonded (connected) together, is publicly known. A plurality of unit cells (functional units of the element) configuring the semiconductor element are electrically connected to the electrode pad, and current flowing through the unit cells is extracted to the outside via the bonding wires and lead portion. In order to cause the current to flow uniformly through the unit cells, the plurality of unit cells are disposed in equal proportions from the electrode pad and wire bonding positions toward the outer side of the semiconductor element. A description will be given of a planar layout of a heretofore known semiconductor device.

FIGS. 16A, 16B, and 16C are plan views showing examples of a planar layout of the heretofore known semiconductor device. FIGS. 16A to 16C show examples of a case wherein wire bonding is performed on the front surface of a semiconductor element (semiconductor chip) 101, in equal proportions in the surface area of the semiconductor element 101 (hereafter described simply as in equal proportions), so that current flows uniformly through unit cells (hereafter referred to as heretofore known examples 1 to 3). The heretofore known examples shown in FIGS. 16A, 16B, and 16C are a package type semiconductor device wherein the semiconductor element 101 is fixed (mounted) to, and a rear surface electrode is connected to, an island portion 100a on a lead frame 100. A plurality of unit cells (not shown) are disposed in an active region (the portion bounded by the rectangular frame indicated by the dashed line) 102 of the semiconductor element 101. The active region 102 is a region through which current flows when in on-state.

Also, in the active region 102, for example, an electrode pad 103 having a substantially rectangular plan-view shape with substantially the same dimensions as those of the active region 102 is disposed on the semiconductor element 101. A plurality of wires 104 are wire bonded (connected) to the electrode pad 103 so as to be positioned in equal proportions in the surface area of the electrode pad 103 (hereafter described simply as positioned in equally proportions). Each wire 104 extracts current from a plurality of unit cells disposed within a predetermined region with the junction with the electrode pad 103 as a center. That is, when it is supposed that the active region 102 is divided equally into a plurality of segments, each of the junctions of the wires 104 and electrode pad 103 is positioned in substantially the center of a portion of the electrode pad 103 positioned in a corresponding segment of the active region 102. Each wire 104 takes charge of the current in a corresponding one of the segments of the active region 102.

Specifically, the heretofore known example 1 shown in FIG. 16A is an example wherein the active region 102 is divided into four rectangular segments 102a to 102d of substantially the same dimensions (divided into quarters) by two straight lines which are parallel to respective two sides sharing one vertex and perpendicular to each other passing through the center of the rectangle. Two wires 104 are joined to the electrode pad 103. The junctions of the wires 104 and electrode pad 103 are positioned one in substantially the center of a portion of the electrode pad 103 positioned in each segment 102a to 102d of the active region 102. The two wires 104 are each joined to two portions of the electrode pad 103 (for example, one wire 104 is joined to portions corresponding to the segments 102a and 102b, and the other wire 104 is joined to portions corresponding to the segments 102c and 102d).

The heretofore known example 2 shown in FIG. 16B is an example wherein the active region 102 is divided into three stripe segments 102e to 102g of substantially the same width (divided equally into thirds) by two straight lines parallel to one side. Three wires 104 are joined to the electrode pad 103. The junctions of the wires 104 and electrode pad 103 are positioned one in substantially the center of a portion of the electrode pad 103 positioned in each segment 102e to 102g of the active region 102. In the heretofore known example 3 shown in FIG. 16C, four wires 104 are joined to the electrode pad 103. The positions of the junctions of the wires 104 and electrode pad 103 are the same as in the heretofore known example 1. Different wires 104 are joined one to each junction with the electrode pad 103.

The portion of each wire depicted in the curved line is a portion which is looped so as to make no contact with the peripheral portion of the semiconductor element 101, and the portion of each wire depicted on the electrode pad 103 in the short vertical line is a junction with the electrode pad 103 (the same applies to FIGS. 17A to 17C). In each heretofore known example 1 to 3, the wires 104 are connected to the lead portion 100b on the lead frame 100, thus electrically connecting the lead portion 100b and the electrode pad 103. The wires 104 have a function to extract to the outside the current flowing through the unit cells disposed in the active region 102. For example, a control electrode pad 105 is disposed in the vicinity of the outer periphery of the active region 102. The control electrode pad 105 is connected to another lead portion 100c on the lead frame 100 by a wire 106.

Also, the semiconductor device is required to respond to a larger current as well as to be more highly functionalized, and sensing or control by an integrated circuit (IC) is being carried out. As the IC which carries out sensing or control is disposed on the semiconductor device, a restriction occurs in electrode pad layout, wire bonding position, or the like. Consequently, it is difficult to equalize the balance of the electrode pad layout, and of the wire bonding positions, on the semiconductor element so that current flows uniformly through the unit cells, and a bias occurs in the size of current flowing through a front surface electrode (an electrode common to the unit cells) of the semiconductor element. In recent years, the channel resistance of unit cells decreases owing to an advancement in microfabrication technology or the like, thus making it easy for the current to flow. Therefore, there is the problem that an increase in the current capacity per unit area leads to a substantial increase in the current density in a portion in which the current concentrates, thus resulting in a decrease in short-circuit resistance.

FIGS. 17A to 17C show examples of a case wherein a bias occurs in the size of the current flowing through the front surface electrode of the semiconductor element 101, due to the fact that the wire bonding positions on the semiconductor element 101 are not in equal proportions in the surface area of the electrode pad 103 (hereafter described simply as not in equal proportions) (hereafter referred to as heretofore known examples 4 to 6). FIG. 17A to 17C are plan views showing other examples of the planar layout of the heretofore known semiconductor device. The heretofore known example 4 shown in FIG. 17A is different from the heretofore known example 3 (refer to FIG. 16C) in that an IC 107, apart from the electrode pad 103, is disposed on the semiconductor element 101. In the heretofore known example 4, a plurality of electrode pads 103 smaller in surface area than in the heretofore known example 3 are disposed in parallel, on the semiconductor element 101, in the vicinity of, and along the outer periphery of, the active region (not shown). An electrode of unit cells (not shown) is provided substantially all over the active region, and the electrode pads 103 are joined to the electrode.

In the heretofore known example 4, as a mask (an IC 107) occupies a large portion on the semiconductor element 101, a region on the semiconductor element 101 in which the electrode pads 103 can be disposed is narrowly limited, and the electrode pads 103 are disposed leaning closer to the outer peripheral side than the central portion of the semiconductor element 101. That is, the plurality of electrode pads 103 cannot be disposed in equal proportions on the semiconductor element 101. Therefore, the junctions of the wires 104 and electrode pads 103 are also not positioned in equal proportions on the semiconductor element 101, and the wire bonding positions lean closer to the outer peripheral side than the central portion of the semiconductor element 101. Consequently, unit cells disposed (on the side of semiconductor portions) immediately below the IC 107 are a long distance from the junctions of the wires 104 and electrode pads 103 compared with unit cells disposed in portions other than immediately below the IC 107.

The heretofore known examples 5 and 6 shown in FIGS. 17B and 17C are different from the heretofore known example 2 (refer to FIG. 16B) in that the positions of the junctions of the wires 104 and electrode pad 103 lean to one side of the electrode pad 103. In the heretofore known example 5, the positions of the junctions of the wires 104 and electrode pad 103 lean to the opposite side (the right side in the drawing) from the side facing the control electrode pad 105. Therefore, the segment 102e, of the segments 102e to 102g of the active region 102, closest to the control electrode pad 105 side (the left side in the drawing) is large in size and in the number of unit cells compared with the other segments 102f and 102g. That is, the unit cells of the segment 102e closest to the control electrode pad 105 side are a long distance from the junctions of the wires 104 and electrode pad 103 compared with the unit cells of the other segments 102f and 102g.

In the heretofore known example 6, the widths of the segments 102e to 102g of the active region 102 are all substantially equal to each other in the same way as in the heretofore known example 2, but the positions of the junctions of the wires 104 and electrode pad 103 lean to the lead portion 100b side (the lower side in the drawing). Therefore, all the segments 102e to 102g of the active region 102 are large in the number of unit cells on the side (the upper side in the drawing) farther apart from the lead portion 100b than the wires 104 compared with on the side closer to the lead portion 100b than the wires 104. That is, the unit cells on the side farther apart from the lead portion 100b than the wires 104 are a long distance from the junctions of the wires 104 and electrode pad 103 compared with the unit cells on the side closer to the lead portion 100b side than the wires 104. This kind of one-sided leaning of the positions of the wire bonding positions in the heretofore known examples 5 and 6 results from, for example, an attempt to improve workability or various factors when assembling.

When the electrode pad layout on and the wire bonding positions on the semiconductor element 101 are not in equal proportions in this way, current flowing from the unit cells toward the wires 104 becomes partially larger, and a bias occurs in the size of current flowing through the front surface electrode of the semiconductor element 101. The reason is as follows. FIG. 18 is an illustration schematically showing a condition wherein a bias is occurring in the size of the current flowing through the front surface electrode of the semiconductor element. FIGS. 19A and 19B are illustrations showing a structure of unit cells in FIG. 18. Herein, as a unit cell, a metal oxide semiconductor field effect transistor (MOSFET) of a trench gate structure is shown by example. In an example wherein a source electrode (a front surface electrode) 120 doubling as the electrode pad 103 is provided substantially all over the active region 102 as in, for example, the heretofore known examples 5 and 6, a condition in the vicinity of one wire 104 joined to the source electrode 120 is shown in FIG. 18.

Also, in FIG. 18, flows of current, which passes through the source electrode 120 and is extracted from the wire 104 to the outside, are shown in order by the arrows identified by signs 121 to 124. The size of the arrows represents the size of the current. FIG. 19A shows a planar structure of semiconductor portions of unit cells, and FIG. 19B shows a sectional structure along the section line AA-AA' of FIG. 19A. In each unit cell, the current 121 flows from the drain side to the source side through an n-type inversion layer (a channel) formed in a portion of a p⁻-type base region 112 along either trench 115, as shown in FIGS. 18, 19A, and 19B. As the current 121 passing through the channels of the unit cells reaches the source electrode 120, passes through the source electrode 120, and is extracted from the wire 104 to the outside, the current 121 collects at the junction 104a of the wire 104 and source electrode 120.

Specifically, as all the unit cells are of the same configuration, the current 121 flows uniformly throughout the semiconductor portions of the semiconductor element 101. Also, in a region (hereafter referred to as a mesa portion) sandwiched between adjacent trenches 115 disposed in a planar layout of stripes, unit cells are disposed in series in a direction in which the trenches extend in stripes. In each mesa portion, as an n⁺-type source region 113 is provided continuously, in the direction in which the trenches 115 extend in stripes, in the inner portion of a p⁻-type base region 112, the channel is formed all over the mesa portion. Therefore, the current 121 passing through the channels of the unit cells reaches the source electrode 120 lower in resistance than the semiconductor portions (mesa portions), from all over the mesa portions, without being suppressed. When the semiconductor element 101 is microfabricated, the number of unit cells disposed in the semiconductor element 101 increases, meaning that the current 121 reaching the source electrode 120 from the unit cells increases.

The current 122 having reached the source electrode 120 flows through the source electrode 120 toward the wire 104. At this time, as the current 123 flowing through the source electrode 120 heads toward the wire 104 while collecting the current 122 having reached the source electrode 120 from other unit cells disposed immediately below current paths, the closer to the wire 104, the larger the current 123. Also, the longer the distance from unit cells disposed on the outermost side (in the vicinity of the outer periphery of the active region 102) to the junction 104a of the wire 104 and source electrode 120, that is, the longer the current paths of the current 123 flowing through the source electrode 120, the larger the number of other unit cells disposed immediately below the current paths. Therefore, the longer the current paths, the more of the current 122, which has reached the source electrode 120 from the other unit cells, the current 123 flowing through the source electrode 120 collects, and the larger the current 123 becomes.

That is, in the heretofore known example 4, the current flowing from the IC 107 side toward the wires 104 is larger than the current flowing from the other portions toward the wires 104. In the heretofore known example 5, the current flowing from the segment 102e closest to the control electrode pad 105 side (the left side in the drawing) toward the wires 104 is larger than the current flowing from the other segments 102f and 102g toward the wires 104. In the heretofore known example 6, the current flowing from the portion (the upper side in the drawing) farther apart from the lead portion 100b than the wires 104 toward the wires 104 is larger than the current flowing from the side closer to the lead portion 100b than the wires 104 toward the wires 104. In this way, in the heretofore known examples 4 to 6, the current concentrates in the vicinity of one portion of the junctions of the wires 104, thus leading to a decrease in short-circuit resistance. In FIG. 18, signs 111, 114, and 116 to 119 are an n⁻-type drift layer, a p⁺-type contact region, a gate insulating film, a gate electrode, and an oxide film, and an interlayer insulating film respectively.

As a configuration which suppresses a decrease in short-circuit resistance due to the current concentration, the following three configurations are common. FIG. 20 is a circuit diagram showing a circuit configuration of a heretofore known semiconductor device. The first configuration is a configuration wherein the current concentration is suppressed by preventing a bias from occurring in the size of the current flowing through the front surface electrode of a semiconductor element 130, by connecting a ballast resistor 132 to the drain of each unit cell 131, as shown in FIG. 20. A configuration wherein a ballast resistor is provided in the inner portion (in the inner portion of the n⁻-type drift layer) of the semiconductor element is proposed (for example, refer to JP-A-5-063185). The second configuration is a configuration wherein the current density in a portion in which current concentrates is reduced by increasing the size (chip size) of the semiconductor element. The third configuration is a configuration wherein the current concentration is suppressed by using unit cells (low in conduction ability) through which it is difficult for the current to flow.

As a device using unit cells low in conduction ability, a device wherein the conduction ability of a cell structure positioned immediately below the junction of an emitter wire is made lower than the conduction ability of another cell structure positioned in a portion other than immediately below the junction of the emitter wire, is proposed (for example, refer to JP-A-2010-00040003 (Paragraphs 0060 and 0061)). Also, as another device, a device wherein the current density in a region close to a bonding pad portion is made lower than the current density in a region apart from the bonding pad portion, is proposed (for example, refer to JP-A-5-063202 (Paragraph 0008)). In JP-A-2010-004003 and JP-A-5-063202, unit cells low in conduction ability are disposed immediately below the junction of the wire wherein the current density is high, thereby reducing the current density, thus relaxing the current concentration immediately below the junction of the wire.

As a device with the conduction ability adjusted, a device including a cell wherein an n⁺-type source region and a p-type base region are in direct contact with an emitter electrode, and a cell wherein the n⁺-type source region and p-type base region are in no direct contact with the emitter electrode by being covered with an interlayer insulating film, is proposed (for example, refer to JP-A-2001-308327 (Paragraphs 0016 and 0017, FIG. 1)). In JP-A-2001-308327, the ratio of the cells wherein the n⁺-type source region and p-type base region are in no direct contact with the emitter electrode is optimized, thus reducing an on-voltage using an injection enhanced (IE) effect, and preventing the current density in channels from decreasing.

Also, as another device, a device wherein in an insulated gate bipolar transistor (IGBT) of a trench gage structure, trenches disposed in a planar layout of stripes, and p-type base regions disposed in a planar layout of stripes, are provided so as to be perpendicular to each other, is proposed (for example, refer to JP-A-2000-228519 (Paragraph 0049, FIG. 6)). In JP-A-2000-228519, unit cells are disposed at predetermined intervals in a direction in which the trenches extend in stripes, and the area occupied by the unit cells is reduced, thereby reducing conduction ability.

Also, as another device, a device wherein a dummy cell configured of only a p⁺-type contact region is provided, so as not to face an IGBT unit cell with a trench sandwiched in between, between IGBT unit cells which are adjacent to each other in a direction in which trenches extend in stripes, between adjacent trenches disposed in a planar layout of stripes, is proposed (for example, refer to JP-A-2007-221012 (Paragraphs 0029 and 0030, FIGS. 1 and 2)). In JP-A-2007-221012, dummy cells, which do not function as IGBTs by providing no n⁺-type emitter region, are selectively disposed, thereby preventing current from being unable to be interrupted when carriers concentrate.

Also, as another device, a device wherein two stripe n⁺-type source regions provided along each trench are cut into non-continuous shapes, between adjacent trenches disposed in a planar layout of stripes, so that the n⁺-type source regions are intermittent at regular intervals and that the n⁺-type source regions of one stripe alternates with the n⁺-type source regions of the other, is proposed (for example, refer to JP-A-2009-289988 (Paragraphs 0012 and 0015, FIGS. 1 and 2) and JP-A-2004-111772 (paragraph 0039, FIG. 2)). In JP-A-2009-289988, n⁺-type source regions of a planar pattern shape in no contact with the whole of the sidewall of each trench are provided, thereby reducing the effective current density in channels so as to suppress a rise in on-resistance and an increase in feedback capacity.

However, in the first to third configurations, it is possible to suppress a decrease in short-circuit resistance due to the current concentration, but a new problem arises. Specifically, in the first and third configurations, the current density in the channels of the unit cells decreases, due to which the on-resistance of the whole of the semiconductor element increases, thus resulting in an increase in conduction loss. In the second configuration, the size (chip size) of the semiconductor element increases, due to which cost increases, and gate capacity increases, thus resulting in an increase in switching loss.

SUMMARY OF THE INVENTION

The invention, in order to solve the heretofore described problems raised by the heretofore known technologies, has for its object to provide a semiconductor device wherein it is possible to suppress a decrease in short-circuit resistance, and it is possible to suppress an increase in the on-resistance of a semiconductor element.

In order to solve the heretofore described problems and achieve the object of the invention, a semiconductor device according to the invention has the following features. A plurality of unit cells are provided in a semiconductor substrate. A front surface electrode common to the plurality of unit cells is provided on the front surface of and all over the semiconductor substrate. Electrode pads are provided leaning closer to the outer peripheral portion side than the central portion of the semiconductor substrate. The electrode pads are in contact with the front surface electrode. The electrode pads occupy a smaller proportion of the surface area of the semiconductor substrate than the front surface electrode. Wires which extract current flowing through the cells to an external location are joined to the respective electrode pads. Further, the cells high in conduction ability are disposed in the vicinity of the junctions of the wires and electrode pads, and the cells low in conduction ability are disposed in positions apart from the junctions.

Also, the semiconductor device according to the invention is such that, in the heretofore described aspect of the invention, two or more kinds of cells different in conduction ability are disposed along the path of current flowing through the front surface electrode from the positions apart from the junctions toward the junctions.

Also, the semiconductor device according to the invention is such that, in the heretofore described aspect of the invention, the cells are disposed so that the farther apart from the junctions, the lower in conduction ability the cells are.

Also, the semiconductor device according to the invention is such that, in the heretofore described aspect of the invention, the cells different in conduction ability are disposed one kind in each of a plurality of segments aligned along the path of current flowing through the front surface electrode.

Also, the semiconductor device according to the invention is such that, in the heretofore described aspect of the invention, the cells include an insulated gate structure formed of a metal oxide film semiconductor, and the conduction ability of the cells is set by adjusting the current density in channels.

Also, the semiconductor device according to the invention is such that, in the heretofore described aspect of the invention, the cells have trenches provided in stripes extending in a direction along the path of current flowing through the front surface electrode, and have a trench gate structure wherein a gate electrode is provided in the inner portion of each trench via a gate insulating film.

According to the aspect of the invention, it is possible to make the current flowing through the unit cells small in positions apart from the junctions of the wires and electrode pads. Therefore, it is possible suppress the current flowing through the front surface electrode becoming larger even when the path of current flowing through the front surface electrode is long, and the number of cells disposed immediately below the current path is large, due to the fact that wire bonding positions lean closer to the outer peripheral portion side than the central portion of the semiconductor element. Therefore, it is possible to relax the current concentration in the end portions of the electrode pads, and thus possible to suppress a decrease in short-circuit resistance due to the current concentration. Also, according to the aspect of the invention, it is possible to relax the concentration of current flowing from the front surface electrode in end portions, of the junctions of the wires and electrode pads, on the central side of the semiconductor element (a semiconductor chip) without connecting a ballast resistor to the drain of each cell or reducing the conduction ability of all the cells. Therefore, it is possible to prevent the current density in the channels from decreasing, and it is possible to suppress a decrease in short-circuit resistance due to the current concentration.

According to the semiconductor device of the invention, the advantage of it being possible to suppress a decrease in short-circuit resistance, and possible to suppress an increase in the on-resistance of the semiconductor element, without connecting a ballast resistor to the drain of each cell or increasing the size of the semiconductor element, is produced.

BRIEF DESCRIPTION OF THE DRAWINGS

FIGS. 17A to 17C are plan views showing other examples of the planar layout of the heretofore known semiconductor device.

DETAILED DESCRIPTION OF THE INVENTION

Figure 1A:
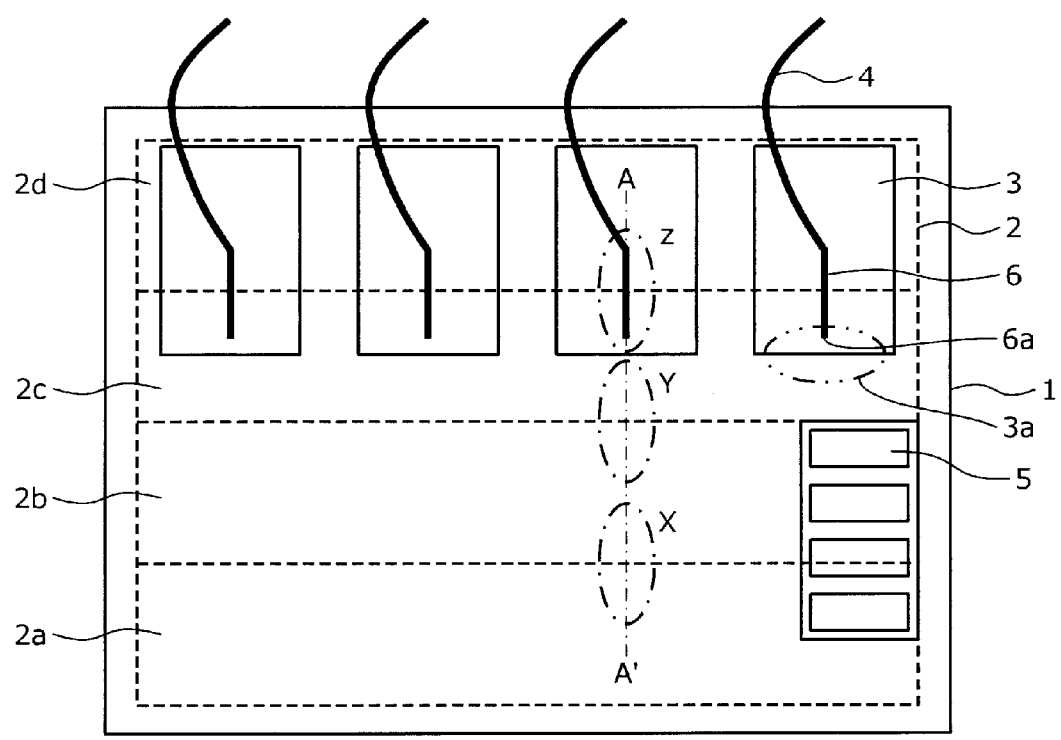
FIG. 1A is a plan view showing a planar layout of a semiconductor device according to a first embodiment.

Hereafter, a detailed description will be given, referring to the drawings, of preferred embodiments of a semiconductor device according to the invention. In the present specification and the accompanying drawings, n or p in layers and regions prefixed with n or p means respectively that electrons or holes are majority carriers. Also, + and − suffixed to n or p respectively mean a higher impurity concentration and lower impurity concentration than in layers and regions affixed with neither + nor −. In the following description of the embodiments and the accompanying drawings, the same signs are given to like components, thus omitting a redundant description.

Embodiment 1

Figure 1B:
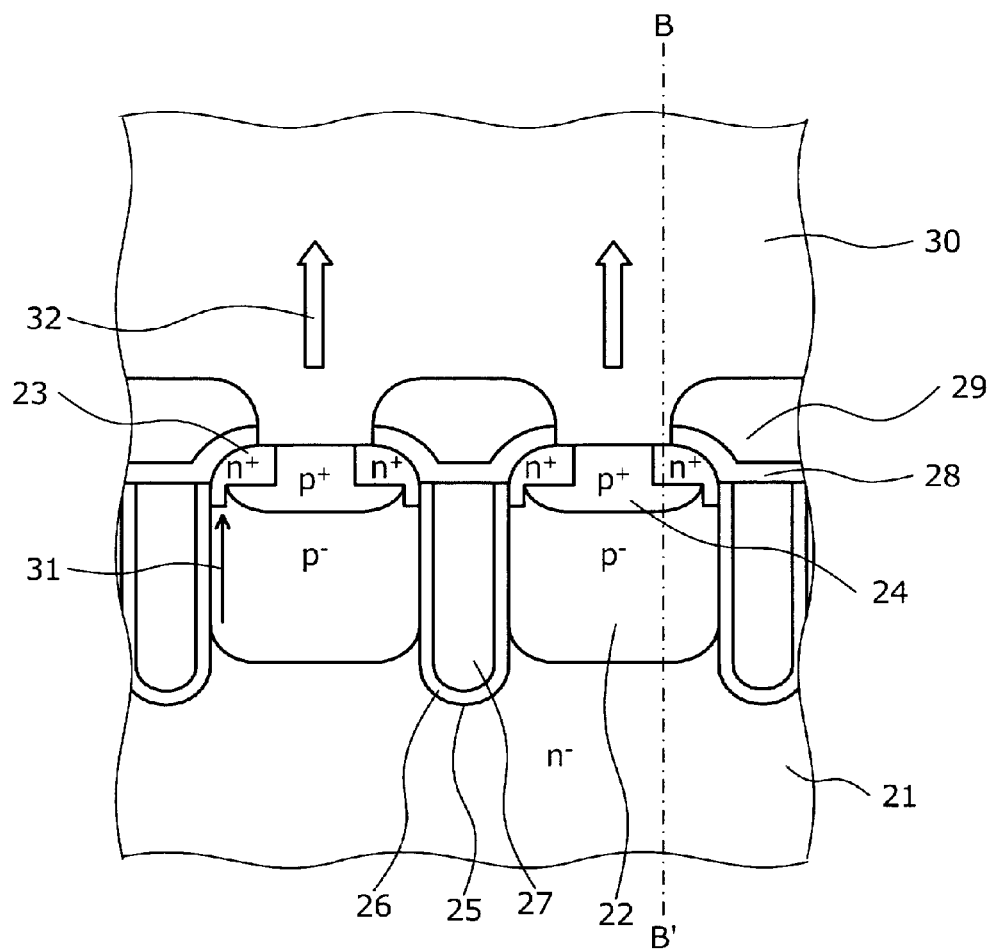
FIG. 1B is a sectional view showing a sectional position of cells along the section line A-A' of FIG. 1A.
Figure 1C:
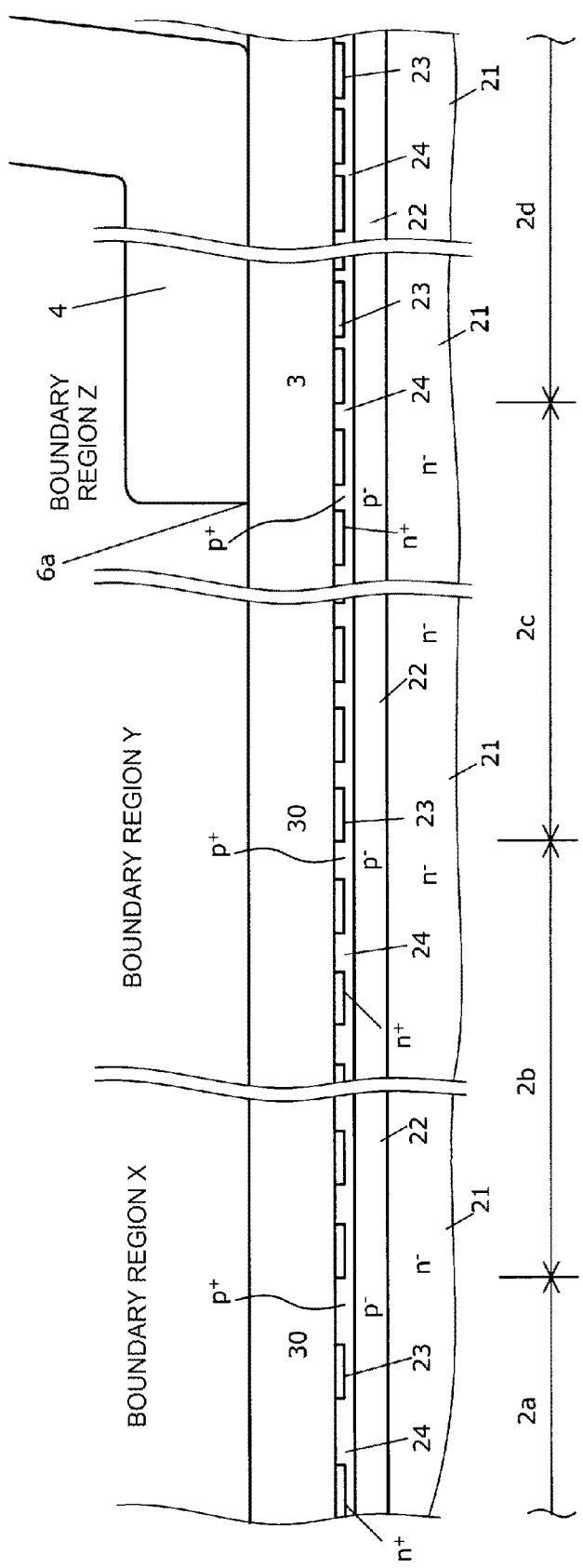
FIG. 1C is a sectional view showing a sectional structure along the section line A-A' of FIG. 1A and the section line B-B' of FIG. 1B.

A description will be given, taking for example the case of using a unit cell (a functional unit of an element: not shown) as a MOSFET, of a structure of a semiconductor device according to a first embodiment. FIG. 1A is a plan view showing a planar layout of the semiconductor device according to the first embodiment. FIG. 1B is a sectional view showing a sectional position of cells along the section line A-A' of FIG. 1A. FIG. 1C is a sectional view showing a sectional structure along the section line A-A' of FIG. 1A and the section line B-B' of FIG. 1B. As shown in FIG. 1A, in the semiconductor device according to the first embodiment, in a semiconductor element (a semiconductor chip) 1 having a substantially rectangular plan-view shape, a plurality of unit cells configuring the semiconductor element 1 are disposed in an active region 2 in a predetermined planar layout. The sectional position of the cells passing through the section line A-A' of FIG. 1A is the position of the section line B-B' of FIG. 1B. The section line B-B' is in the position of vertically sectioning a source electrode 30, a $p^+$-type contact region 24, an $n^+$-type source region 23, a $p^-$-type base region 22, and an $n^-$-type drift layer 21.

FIG. 1C shows a sectional structure of a boundary region X of a first segment 2a and second segment 2b of the active region 2, a boundary region Y of the second segment 2b, and a third segment 2c, of the active region 2, and a boundary region Z of the third segment 2c and a fourth segment 2d, from a position apart from a wire bonding position (a junction position of a wire 4) to the wire bonding position. Unit cells low in conduction ability with the $n^+$-type source regions 23 reduced in number are disposed in the boundary region X apart from the wire bonding position. Unit cells high in conduction ability with the $n^+$-type source regions 23 increased in number toward the wire bonding position are disposed in the boundary region Y. Unit cells highest in conduction ability with the $n^+$-type source regions 23 most increased in number are disposed in the boundary region Z which is in the vicinity of the center of the wire bonding position. The planar layout of the unit cells will be described hereafter. The active region 2 is a region through which current flows when in on-state.

A front surface electrode (a front surface electrode common to the unit cells: not shown) of the semiconductor element 1 is provided, substantially all over the active region 2, on the front surface of the semiconductor element 1. A plurality of electrode pads 3 are disposed in parallel, on the front surface electrode, leaning closer to the outer peripheral portion side than the central portion of the active region 2, and along the outer peripheral side of the active region 2. All the front surface electrode side surface of each electrode pad 3 is joined to the front surface of the front surface electrode. The electrode pads 3 occupy a smaller proportion of the front surface area of the semiconductor element 1 than the front surface electrode. Different wires 4 are joined (bonded) one to, for example, substantially the center of each respective electrode pad 3. The wires 4 are connected to, for example, an identical lead portion on a lead frame (not shown), thus electrically connecting the lead portion and the electrode pads 3. The wires 4 have a function to extract current, which flows through the unit cells disposed in the active region 2, to an external location.

Figure 2:
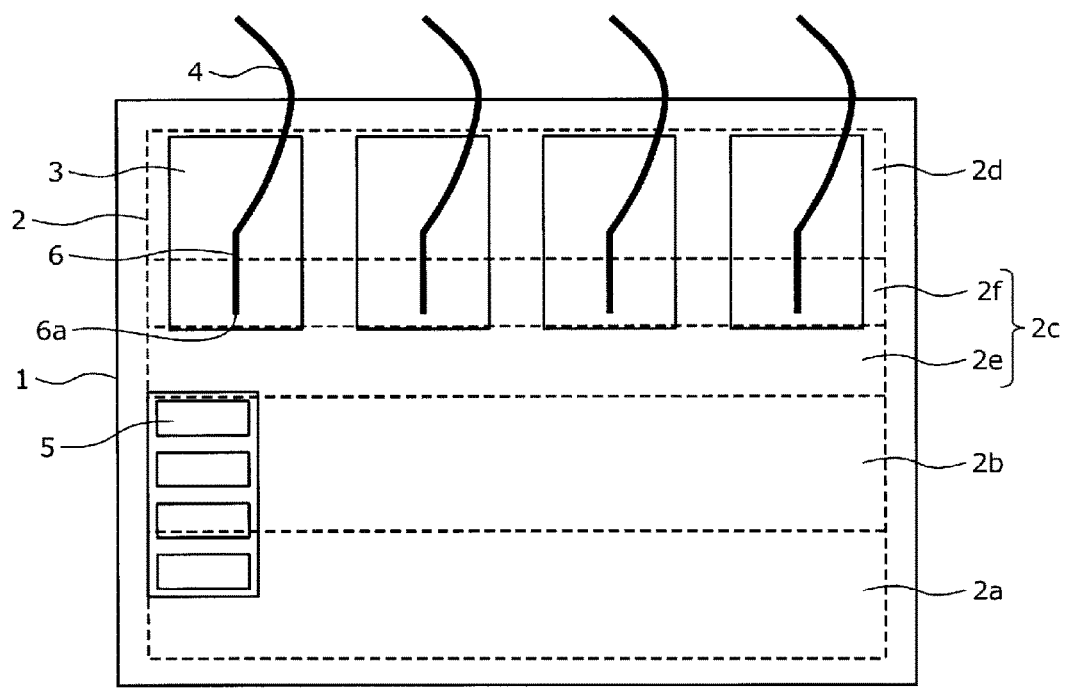
FIG. 2 is a plan view showing a planar layout of another example of the semiconductor device according to the first embodiment.

A portion of each wire 4 depicted in a curved line is a portion looped so as not to make contact with the peripheral portion of the semiconductor element 1, and a portion of each wire 4 depicted in a short vertical line on each respective electrode pad 3 is a junction 6 with the electrode pad 3 (the same applies to FIG. 2). For example, a mask, such as an IC (not shown) for carrying out sensing or control, and various electrode pads 5, such as a gate electrode pad, a current detection electrode pad, and a temperature detection electrode pad, are disposed in portions on the semiconductor element 1 other than the portions in which the electrode pads 3 are disposed. That is, the mask is disposed on the semiconductor element 1, due to which the electrode pads 3 cannot be disposed in equal proportions in the surface area of the semiconductor element 1, thus narrowly limiting a region on the semiconductor element 1 in which the electrode pads 3 can be disposed.

A bias occurs in the size of current flowing through the front surface electrode due to the electrode pads 3 being disposed leaning closer to the outer peripheral portion side than the central portion of the semiconductor element 1 (that is, due to the positions of the electrode pads 3 not being in equal proportions in the surface area of the semiconductor element 1). Therefore, the current flowing through the front surface electrode of the semiconductor element 1 concentrates in a portion (on the side of a semiconductor portion) immediately below an end portion 6a of the junction of each wire 4 and electrode pad 5, and the current concentrates in an end portion 3a of each electrode pad 3 on the central side on which a mask such as the IC is disposed. Therefore, two or more kinds of unit cells different in conduction ability are disposed in the active region 2, thus relaxing the current concentration in the electrode pad end portion 3a which is on the central side of the semiconductor element 1 within each electrode pad 3 and which is in the vicinity of the end portion 6a of the junction of each wire and electrode pad.

The two or more kinds of unit cells different in conduction ability are disposed based on the distance from the unit cells to the junctions 6 of the wires 4 and electrode pads 3. Specifically, unit cells high in conduction ability are disposed in the vicinity of the junctions 6 of the wires 4 and electrode pads 3. Further, unit cells low in conduction ability are disposed in positions apart from the junctions 6 of the wires 4 and electrode pads 3. It is more preferable that the unit cells are disposed so that the farther apart from the junctions 6 of the wires 4 and electrode pads 3, the lower in conduction ability the unit cells are.

Being high in conduction ability is that owing to a high current density in channels, a large current capacity, or the like, it is easy for the current to flow through the unit cells. Being low in conduction ability is that due to a low current density in channels, a small current capacity, or the like, it is difficult for the current to flow through the unit cells. The conduction ability of the unit cells can be adjusted by variously changing, for example, the planar layout of a source region or contact region configuring the structure (not shown) of a MOS gate (an insulated gate formed of a metal oxide film semiconductor). A description will be given, in second to fifth embodiments to be described hereafter, of a structure of a unit cell, the conduction ability of which can be adjusted, and a sectional structure of the unit cell. The reasons that the two or more kinds of unit cells different in conduction ability are disposed in the active region 2, as heretofore described, are as follows.

The path of the current flowing through the unit cells when in on-state diverges normally into the path of current flowing through the semiconductor portions and the path of current flowing from the semiconductor portions toward the front surface electrode. Current passing through the channels of the unit cells (current flowing through the front surface side of the chip) reaches the front surface electrode lower in resistance than the semiconductor portions, flows through the front surface electrode toward the electrode pads 3, and is extracted to an external location from the wires 4. At this time, in the vicinity of the junctions 6 of the wires 4 and electrode pads 3, the current having reached the front surface electrode from the semiconductor portions is immediately extracted by the wires 4 via the electrode pads 3. Therefore, in the vicinity of the junctions 6 of the wires 4 and electrode pads 3, the current flows substantially uniformly through the front surface electrode, and is difficult to concentrate locally. Therefore, the conduction ability of the whole of the semiconductor element 1 is heightened by disposing the unit cells, which are high in conduction ability, in the vicinity of the junctions 6 of the wires 4 and electrode pads 3, as heretofore described.

Meanwhile, the current, which has reached the front surface electrode from the semiconductor portions of the unit cells disposed in positions apart from the junctions 6 of the wires 4 and electrode pads 3, flows through the front surface electrode substantially linearly toward the electrode pads 3 (the junctions 6 with the wires 4) lower in resistance. The current flowing through the front surface electrode toward the electrode pads 3 in this way (hereafter referred to as the current flowing through the front surface electrode) becomes larger toward the wires 4 because the current heads toward the wires 4 while collecting the current having reached the front surface electrode from the semiconductor portions of the other unit cells disposed immediately below the current path. Therefore, the current concentrates in the end portions 6a, of the junctions of the wires 4 and electrode pads 3, on the central side of the semiconductor element 1 within the respective electrode pads 3, and the current density in the electrode pad end portions 3a increases, meaning that there is fear that heat is generated or destruction follows. Therefore, in the invention, the unit cells are disposed so that the further apart from the junctions 6 of the wires 4 and electrode pads 3, the lower in conduction ability the unit cells are, as heretofore described. By so doing, the current flowing through the front surface electrode reaches the electrode pads while collecting the current flowing through the semiconductor portions of the unit cells low in conduction ability. Therefore, it is possible to relax the electric field concentration in the electrode pad end portions 3a.

More specifically, the active region 2 is divided into, for example, two or more stripe segments extending in a direction in which the electrode pads are aligned (a horizontal direction in the drawing, hereafter referred to as a first direction), and the kinds of unit cells different in conduction ability are disposed one kind in each of the segments of the active region 2. Herein, a description will be given, as an example, of a case wherein the active region 2 is divided into, for example, four segments (hereafter referred to as first to fourth segments) 2a to 2d. The first segment 2a is in a position farthest from the junctions 6 of the wires 4 and electrode pads 3. The second segment 2b, third segment 2c, and fourth segment 2d are positioned in order from the first segment 2a toward the junctions 6 of the wires 4 and electrode pads 3 in a direction perpendicular to the direction (first direction) in which the electrode pads 3 are aligned. For example, the third segment 2c side end portions 3a of the electrode pads 3, on which it is easiest for the current to concentrate, which are on the central side of the semiconductor element 1 within the electrode pads 3 and which are in the vicinity immediately below the end portions 6a of the junctions of the wires 4 and electrode pads 3, are positioned in the third segment 2c. The first segment 2a side end portions 6a of the junctions 6 of the wires 4 and electrode pads 3 may be positioned in the third segment 2c. The fourth segment 2d is in a position closest to the junctions 6 of the wires 4 and electrode pads 3.

Portions of the electrode pads 3 other than the portions positioned in the third segment 2c are positioned in the fourth segment 2d. Substantially the whole of each of the junctions 6 of the wires 4 and electrode pads 3 is positioned in the fourth segment 2d. In the active region 2 divided in this way, unit cells lowest in conduction ability are disposed in the first segment 2a farthest from the junctions 6 of the wires 4 and electrode pads 3. The unit cells are disposed in the second to fourth segments 2b to 2d so that the closer to the junctions of the wires 4 and electrode pads 3, the higher in conductablity the unit cells are, and unit cells highest in conduction ability are disposed in the fourth segment 2d closest to the junctions 6 of the wires 4 and electrode pads 3. That is, in the first to fourth segments 2a to 2d divided so as to be aligned along the path of the current flowing through the front surface electrode, the unit cells different in conduction ability from one another are disposed so that the conduction ability of the first segment 2a<the conductivity of the second segment 2b<the conduction ability of the third segment 2c<the conduction ability of the fourth segment 2d.

Also, although depending on design conditions such as a restriction on a package type semiconductor device, it is preferable that current (hereafter referred to as current flowing through the semiconductor portions), of the current flowing through the unit cells, other than the current having flowed to the front surface electrode through the channels, flows in the same direction (that is, the second direction) as the current flowing through the front surface electrode. Specifically, it is good that the unit cells are connected in series in the direction in which the current flowing through the front surface electrode flows. More specifically, for example, when making the unit cells into a trench gate structure, trenches (not shown) are disposed in a planar layout of stripes extending in the second direction, and a plurality of unit cells are disposed, in each region (mesa portion) sandwiched between adjacent trenches, in the second direction. Further, a plurality of unit cells only have to be disposed in the same mesa portion in the second direction so that the closer to the junctions 6 of the wires 4 and electrode pads 3, the higher in conduction ability the unit cells are. That is, it is only necessary to provide gate electrodes in stripes extending in the same direction as the current flowing through the front surface electrode.

The reason that the unit cells are disposed in series in the same direction as the current flowing through the front surface electrode is as follows. Hypothetically, when the unit cells are disposed in series in a direction perpendicular to the current flowing through the front surface electrode (that is, in the first direction), the current flowing through the semiconductor portions flows toward the wires 4, meaning that the current flowing through the semiconductor portions does not flow between the unit cells connected in series, and flows to the front surface electrode. Therefore, there is fear that the current density of the front surface electrode increases, thus leading to an increased bias in the size of the current flowing through the front surface electrode. Also, when the unit cells are disposed in series in a direction perpendicular to the current flowing through the front surface electrode, the gate electrodes extend in a direction perpendicular to a direction (the vertical direction in the drawing) in which the junctions 6 of the wires 4 and electrode pads 3 extend. Therefore, when bonding the wires 4, the gate electrodes are pressurized in a direction perpendicular to a direction in which the gate electrodes extend, and there is fear that the gate electrodes are crushed. This easily results in a defective element. This problem is prominently manifested especially when the unit cells are made into a planar gate structure wherein MOS gates are provided in a planar form on a semiconductor substrate. Meanwhile, the reason that the unit cells are disposed in series in the same direction as the current flowing through the front surface electrode is that as the current flowing through the front surface electrode flows between the unit cells connected in series in this case, it is possible to suppress an increase in the current density of the front surface electrode due to the current flowing through the semiconductor portions.

Also, for example, when using a rectangular semiconductor chip, it is preferable to dispose the electrode pads 3 so that the current flowing through the front surface electrode toward the electrode pads 3 flows in a direction parallel to the short sides of the chip. The reason is that it is possible to suppress a rise in gate resistance. Specifically, it is only necessary to dispose a plurality of the electrode pads 3 along a long side of the active region 2 having substantially the same plan-view shape as the semiconductor chip. By so doing, current flows through the front surface electrode, connected to the electrode pads 3, toward the electrode pads 3 in a direction parallel to the short sides of the active region 2 (that is, in the second direction) (in the vertical direction from the lower side toward the upper side of the drawing).

It is preferable that the thickness of the front surface electrode of the unit cells is, for example, on the order of 5 μm or less. The reasons are as follows. The front surface electrode is made from, for example, an aluminum (Al)-based metal such as aluminum-silicon (Si). When the thickness of the front surface electrode is thick, a bias in the size of the current flowing through the front surface electrode is easy to relax depending on the thickness of the front surface electrode even without applying the invention. As opposed to this, as the thinner the thickness of the front surface electrode is, the more difficult the bias in the size of the current flowing through the front surface electrode is to relax, and the easier it is for the current to concentrate in the front surface electrode, it is easy to obtain the advantages of the invention. This is one reason. Also, another reason is that there is a limitation in forming the front surface electrode thick in terms of facility capacity, manufacturing cost, or the like. Even when the front surface electrode is formed in a square frustum shape, or in a shape having a step on the side of the surface joined to the electrode pad 3, by gradually reducing the thickness of the front surface electrode, there are the same advantages as when the front surface electrode is rectangular. The larger the current flowing through the front surface electrode, the greater the advantages of the invention, and it is preferable that the current characteristics of the semiconductor element 1 are set so as to be, for example, on the order of 200 A because it is thereby easier to obtain the advantages of the invention.

Also, a plurality of unit cells may be disposed in a distribution having a gradient such that the farther apart from the junctions 6 of the wires 4 and electrode pads 3, the lower in conduction ability the unit cells are, without dividing the active region 2 into a plurality of segments. Also, the unit cells low in conductablity may be disposed with the active region 2 divided into smaller segments in a portion for which short-circuit resistance is required, and the current density of the whole of the semiconductor element 1 may be increased by disposing the unit cells high in conduction ability with the area proportion, occupied by the segments of the active region 2, increased in a portion for which no short-circuit resistance is required.

Also, for example, a configuration may be such that the vicinity of the third segment 2c side end portion 3a of the electrode pad 3, on which it is easiest for the current to concentrate, which is on the central side of the semiconductor element 1 within the electrode pad 3 and which is in the vicinity of the end portion 6a of the junction of the wire 4 and electrode pad 3, is divided into still smaller segments, and that the kinds of unit cells different in conductablity are disposed one kind in each segment. FIG. 2 is a plan view showing a planar layout of another example of the semiconductor device according to the first embodiment. Specifically, for example, as shown in FIG. 2, the third segment 2c may be divided into a segment 2e on the second segment 2b side and a segment 2f on the fourth segment 2d side, with the third segment 2c side end portion 3a of the electrode pad 3, on which it is easiest for the current to concentrate and which is in the vicinity of the end portion 6a of the junction of the wire and electrode pad, as a boundary (that is, the active region 2 is divided into five segments 2a, 2b, 2e, 2f, and 2d). In this case, unit cells higher in conductablity than in the second segment 2b side segment 2e are disposed in the fourth segment 2d side segment 2f of the third segment 2c. A configuration other than the third segment 2c of the other example of the semiconductor device according to the first embodiment shown in FIG. 2 is the same as in the semiconductor device according to the first embodiment shown in FIGS. 1A to 1C.

Figure 3:
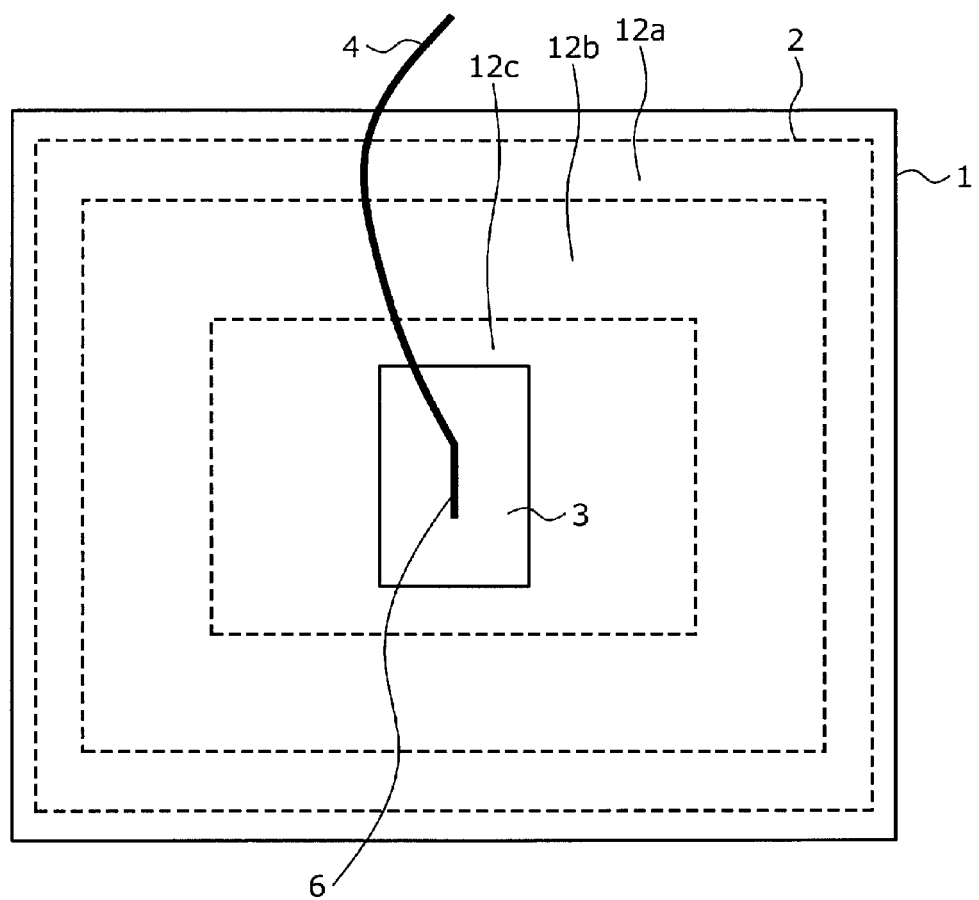
FIG. 3 is a plan view showing a planar layout of another example of the semiconductor device according to the first embodiment.

Also, the invention can also be applied to a case wherein the electrode pads 3 (the wires 4) are disposed in substantially equal proportions on the semiconductor element 1. FIG. 3 is a plan view showing a planar layout of another example of the semiconductor device according to the first embodiment. FIG. 3 shows a case wherein the junction 6 of the wire 4 and electrode pad 3 is positioned in the central portion of the semiconductor element 1. As shown in FIG. 3, for example, the electrode pad 3 is disposed in substantially the center of the semiconductor element 1, and the active region 2 is divided into, for example, three, first to third segments 12a to 12c in concentric circles (in FIG. 3, in rectangular rings) with the electrode pad 3 as a center. In this case, unit cells (outermost unit cells) disposed in the vicinity of the outer periphery of the active region 2 are substantially equal in distance from the electrode pad 3. Therefore, it is difficult for a bias to occur in the size of the current flowing through the front surface electrode, thus reducing the advantages of the invention, but it is possible to relax the electric field concentration in the electrode pad 3 compared with when the invention is not applied.

As heretofore described, according to the first embodiment, by unit cells being disposed so that the farther apart from the junctions of the wires and electrode pads, the lower in conduction ability the unit cells are, it is possible to make the current flowing through the unit cells small in portions apart from the junctions of the wires and electrode pads. Therefore, it is possible to suppress the current, flowing through the front surface electrode, becoming larger even when the path of the current flowing through the front surface electrode is long and the number of unit cells disposed immediately below the current path is large, due to the fact that the wire bonding positions lean closer to the outer peripheral portion side than the central portion of the semiconductor element. Therefore, it is possible to relax the current concentration in the third segment side end portions of the electrode pads in the vicinity of the end portion 6a of the junctions of the wires and electrode pads, and thus possible to suppress a decrease in short-circuit resistance due to the current concentration.

Also, according to the first embodiment, it is possible to relax the current concentration in the third segment side end portions of the electrode pads in the vicinity of the end portions 6a of the junctions of the wires and electrode pads without connecting a ballast resistor to the drain of the unit cell (the first configuration) or reducing the conduction ability of all the unit cells (the third configuration). Therefore, it is possible to suppress an increase in the on-resistance of the semiconductor element by preventing a reduction in the current density in the channels, and it is possible to suppress a decrease in short-circuit resistance due to the current concentration. Also, according to the first embodiment, it is possible to make the current density in the channels of the unit cells, in the vicinity of each of the junctions of the wires and electrode pads, higher than in heretofore known structures (for example, JP-A-2010-004003 and JP-A-5-063202). Therefore, as it is possible to heighten the current density of the whole of the semiconductor element, it is possible to suppress a rise in the on-resistance, and thus possible to reduce a conduction loss.

Embodiment 2

Figure 4:
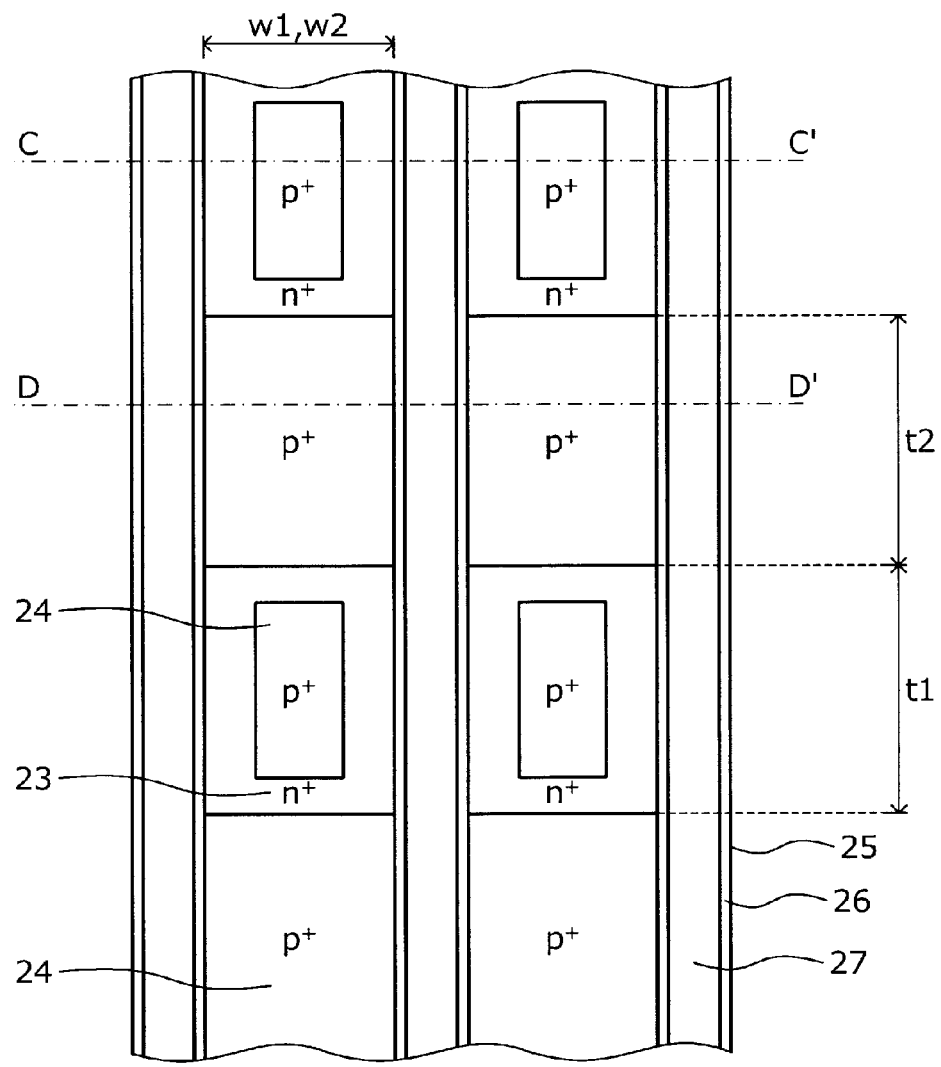
FIG. 4 is a plan view showing a planar layout of a semiconductor device according to a second embodiment.
Figure 5:
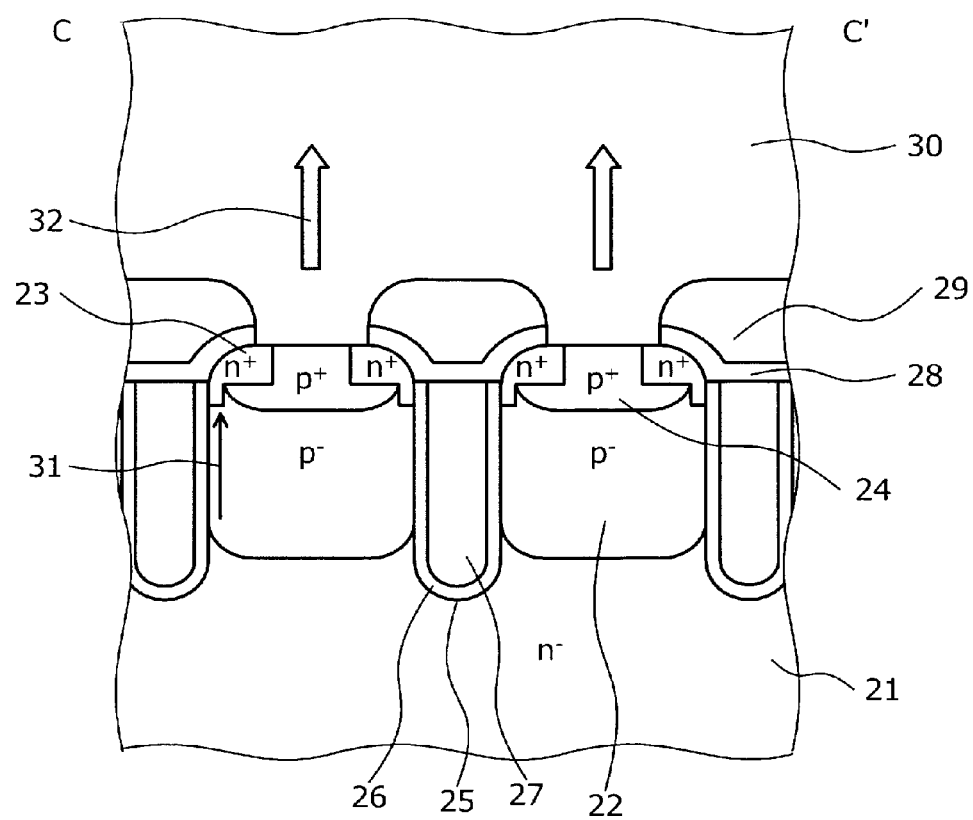
FIG. 5 is a sectional view showing a sectional structure along the section line C-C' of FIG. 4.
Figure 6:
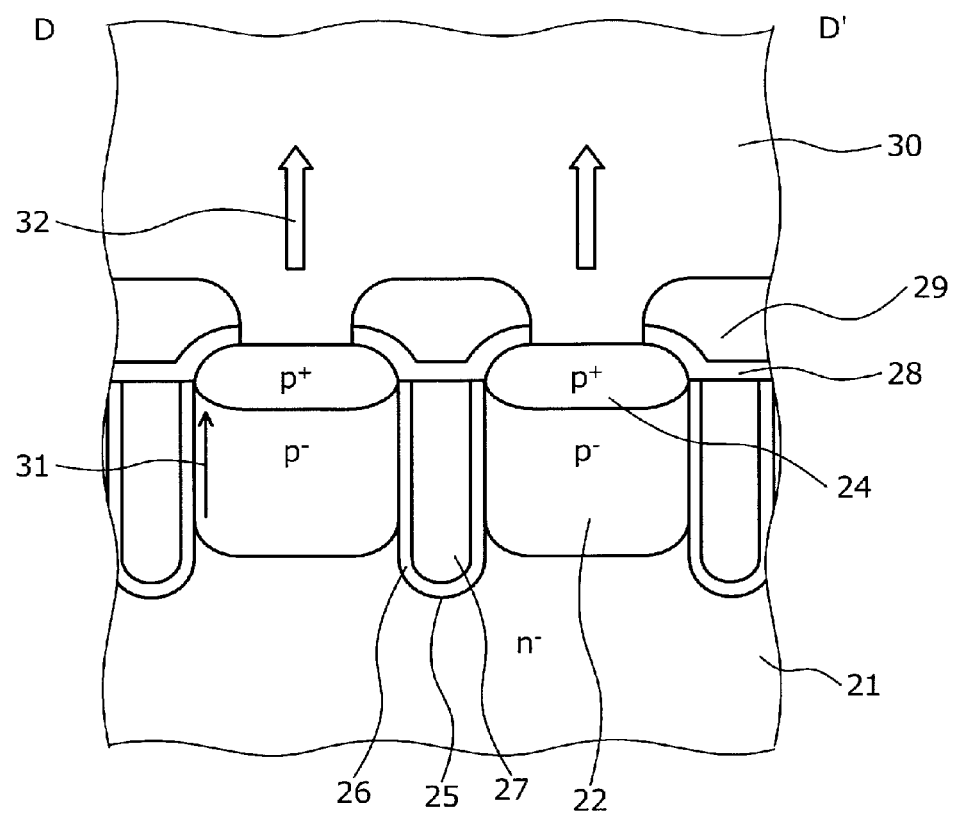
FIG. 6 is a sectional view showing a sectional structure along the section line D-D' of FIG. 4.

Next, a description will be given, as a semiconductor device according to a second embodiment, of one example of a structure of unit cells disposed in the active region 2. FIG. 4 is a plan view showing a planar layout of the semiconductor device according to the second embodiment. FIG. 5 is a sectional view showing a sectional structure along the section line C-C' of FIG. 4. FIG. 6 is a sectional view showing a sectional structure along the section line D-D' of FIG. 4. FIG. 4 shows a planar layout of semiconductor portions exposed to the front surface (the front surfaces of the semiconductor portions) of a semiconductor substrate (a semiconductor chip) (the same applies to FIGS. 7 and 10). In FIGS. 5 and 6, currents flowing through the unit cells when in on-state are shown in order by the arrows identified by signs 31 and 32 (the same applied to FIGS. 8, 9, 11, and 12). As shown in FIGS. 4 to 6, a trench gate type MOS gate structure is provided on the front surface side of an n$^-$-type semiconductor substrate (a semiconductor chip) forming an n$^-$-type drift layer 21.

The MOS gate structure is formed of a p$^-$-type base region 22, an n$^+$-type source region 23, a p$^+$-type contact region 24, a trench 25, a gate insulating film 26, and a gate electrode 27. Specifically, the p$^-$-type base region 22 is provided in a surface layer of the n$^-$-type drift layer 21 on the substrate front surface (a first principal surface) side. The trench 25 passing through the p$^-$-type base region 22 and reaching the n$^-$-type drift layer 21 is provided. The trenches 25 are disposed in a planar layout of stripes extending in, for example, a second direction (a vertical direction in the drawing). The gate insulating film 26 is provided along the inner wall of the trench 25, and the gate electrode 27 is provided, on the inner side of the gate insulating film 26, in the inner portion of each trench 25. The n$^+$-type source regions 23 and the p$^+$-type contact regions 24 are selectively provided, in the substrate front surface side surface layer, in the inner portion of the p$^-$-type base region 22. The n$^+$-type source regions 23 are provided at predetermined intervals in the second direction.

A width (the width of a widest portion) w1 in the first direction of the n$^+$-type source region 23 is equal to a distance w2 between adjacent trenches 25. Each n$^+$-type source region 23 is opposed to either adjacent gate electrode 27 via the gate insulating film 26 provided on the side wall of the trench 25. Each n$^+$-type source region 23 may be formed in, for example, a substantially rectangular frame plan-view shape surrounding the p$^+$-type contact region 24. A portion of the substrate front surface side surface layer of the p$^-$-type base region 22 other than the n$^+$-type source region 23 is all the p$^+$-type contact region 24. That is, the n$^+$-type source regions 23 and the p$^+$-type contact regions 24 are disposed, alternately in the second direction, in a region (a mesa portion) sandwiched between adjacent trenches 25. In a portion in which no n$^+$-type source region 23 is provided, the p$^+$-type contact regions 24 are opposed to either adjacent gate electrode 27 via the gate insulating film 26 provided on the sidewall of the trench 25.

The configurations of the mesa portions are the same, and the n$^+$-type source regions 23 disposed in their respective adjacent mesa portions are opposed to each other in the first direction (the horizontal direction in the drawing) with the trench 25 sandwiched in between. That is, the n$^+$-type source regions 23 are disposed in stripes in the first direction. In on-state, an n-type inversion layer (a channel) is formed in a portion of the p$^-$-type base region 22 sandwiched between the n$^+$-type source region 23 and the n$^-$-type drift layer 21 (that is, a portion along the sidewalls of adjacent trenches 25). That is, in the same mesa portion, the channels are formed in portions in which the n$^+$-type source regions 23 are provided, and are not formed in portions (the p$^+$-type contact regions 24) sandwiched between the n$^+$-type source regions 23 which are adjacent to each other in the second direction.

By so doing, the current 31, which passes through the channels formed in the portions of the p$^-$-type base region 22 along the trenches 25 and reaches the source electrode (the front surface electrode common to the unit cells) 30, becomes smaller when passing through the p$^+$-type contact regions 24 or passing immediately below (the drain sides of) the p$^+$-type contact regions 24. That is, the p$^+$-type contact regions 24 function as resistors, and can make it difficult for the current 31, which passes through the channels and reaches the source electrode 30, to flow. In order to adjust the conduction ability of the unit cells (the current density in the channels), it is only necessary to variously change a width t1 in the second direction of the n$^+$-type source regions 23 and a pitch t2 in the second direction of the n$^+$-type source regions 23 (the width in the second direction of the p$^+$-type contact regions 24). The more the area occupied by the p$^+$-type contact regions 24 is increased, the lower the conduction ability can be made.

A high temperature oxide (HTO) film 28 and an interlayer insulating film 29 are provided in order on the gate electrodes 27. The interlayer insulating film 29 is made from, for example, borophosphosilicate glass (BPSG). Contact holes through which to expose the n⁺-type source regions 23 and p⁺-type contact regions 24 are provided passing through the high temperature oxide film 28 and interlayer insulating film 29. The contact holes, having a linear plan-view shape extending in the second direction, substantially expose the mesa portion (the n⁺-type source regions 23 and p⁺-type contact regions 24). The front surface electrode forming the source electrode 30 common to the unit cells is provided substantially all over the active region 2, so as to fill the contact holes, on the interlayer insulating film 29.

The source electrode 30 is in contact with the n⁺-type source regions 23 and p⁺-type contact regions 24 via the contact holes, and is electrically insulated from the gate electrodes 27 by the interlayer insulating film 29. A plurality of electrode pads (source electrode pads) 3 are joined to the front surface of the source electrode 30 (not shown in FIGS. 4 to 12, and as for the electrode pads 3, refer to FIGS. 1A to 3). An unshown n⁺-type drain region and drain electrode common to the unit cells are provided, all over a substrate rear surface (a second principal surface), on the substrate rear surface side of the n⁻-type drift layer 21. A rear surface electrode forming the drain electrode is joined to, for example, an island portion on a lead frame (not shown).

As heretofore described, according to the second embodiment, it is possible to adjust the conduction ability of the unit cells by disposing the n⁺-type source regions at predetermined intervals in a direction (the second direction) in which the trenches extend in stripes. It is possible to fabricate (manufacture) the semiconductor device according to the first embodiment by using the unit cells as being of one kind, of the two or more kinds of unit cells different in conduction ability which are disposed in the active region.

Embodiment 3

Figure 7:
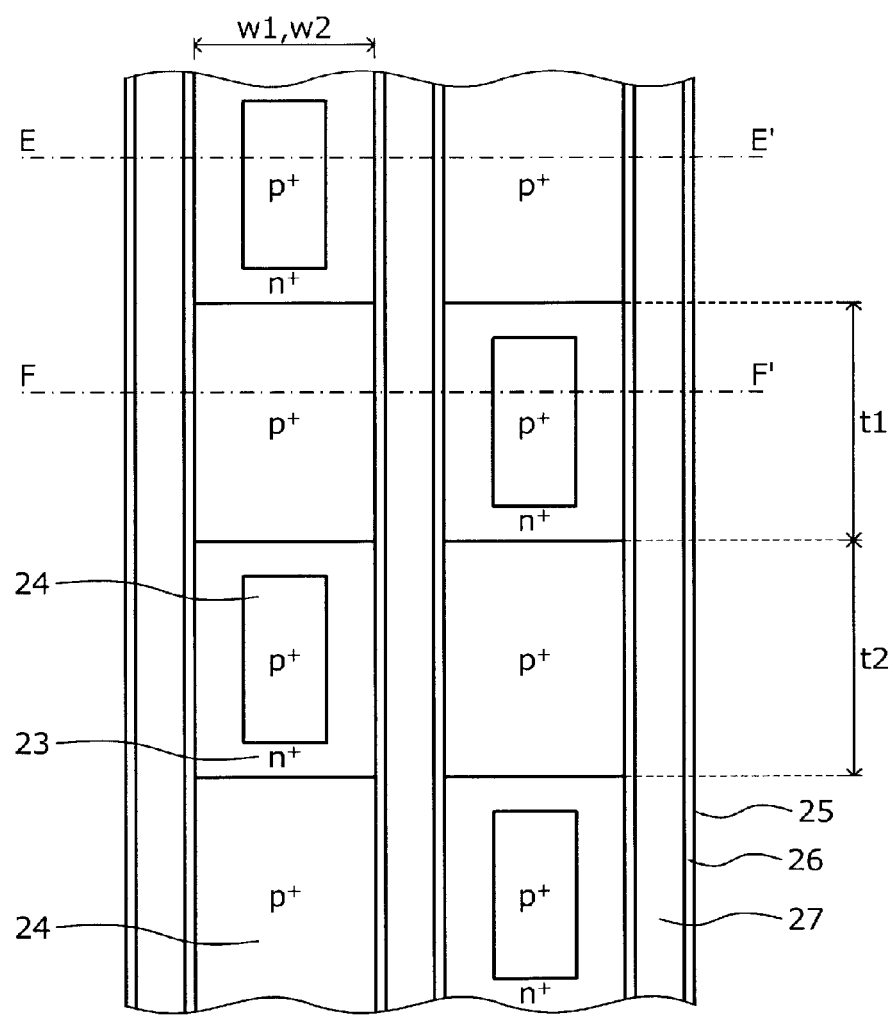
FIG. 7 is a plan view showing a planar layout of a semiconductor device according to a third embodiment.
Figure 8:
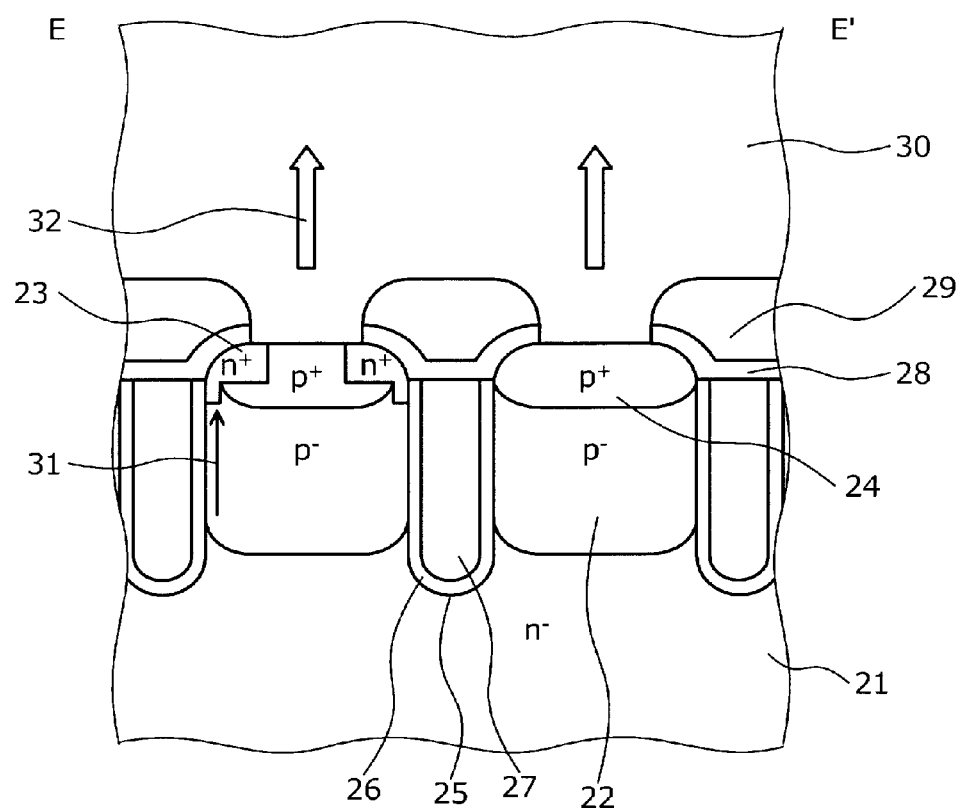
FIG. 8 is a sectional view showing a sectional structure along the section line E-E' of FIG. 7.
Figure 9:
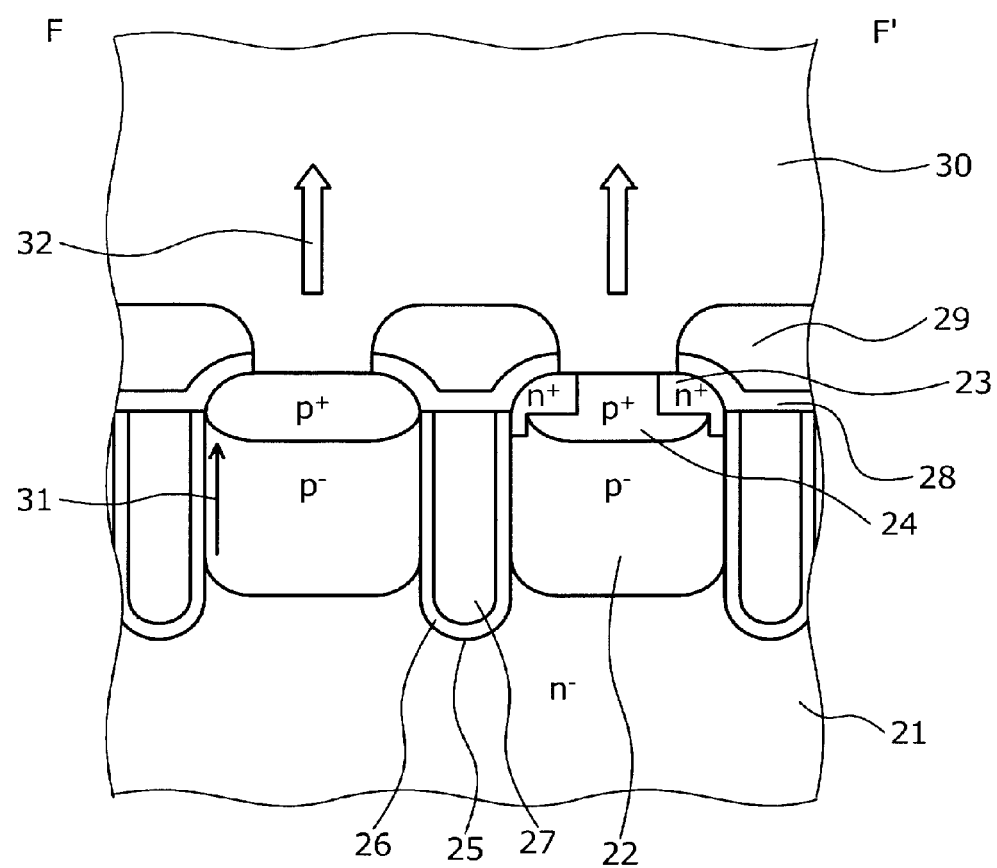
FIG. 9 is a sectional view showing a sectional structure along the section line F-F' of FIG. 7.

Next, a description will be given, as a semiconductor device according to a third embodiment, of one example of a structure of unit cells disposed in the active region 2. FIG. 7 is a plan view showing a planar layout of the semiconductor device according to the third embodiment. FIG. 8 is a sectional view showing a sectional structure along the section line E-E' of FIG. 7. FIG. 9 is a sectional view showing a sectional structure along the section line F-F' of FIG. 7. The semiconductor device according to the third embodiment is different from the semiconductor device according to the second embodiment in that the n⁺-type source regions 23 disposed in adjacent mesa portions are disposed so as not to be opposed to each other in the first direction with the trench 25 sandwiched in between. That is, the n⁺-type source regions 23 are disposed in a checkered planar layout.

By disposing the n⁺-type source regions 23 in a checkered planar layout, it is possible to dispose portions, in which to form channels substantially continuously in the second direction with the trench 25 sandwiched in between, over adjacent mesa portions. Therefore, the current 31, which passes through the channels formed in the p⁻-type base regions 22 and reaches the source electrode 30, flows through the p⁻-type base regions 22 along the trenches 25 without passing through the p⁺-type contact regions 24, and heads toward the n⁺-type source regions 23 disposed in adjacent mesa portions. Therefore, as it is possible to cause the current 32 to flow uniformly through the source electrode 30 compared with in the case wherein the n⁺-type source regions 23 are disposed in stripes in the first direction, it is possible to suppress a rise in the on-resistance of the semiconductor element 1.

As heretofore described, according to the third embodiment, it is possible to obtain the same advantages as in the second embodiment.

Embodiment 4

Figure 10:
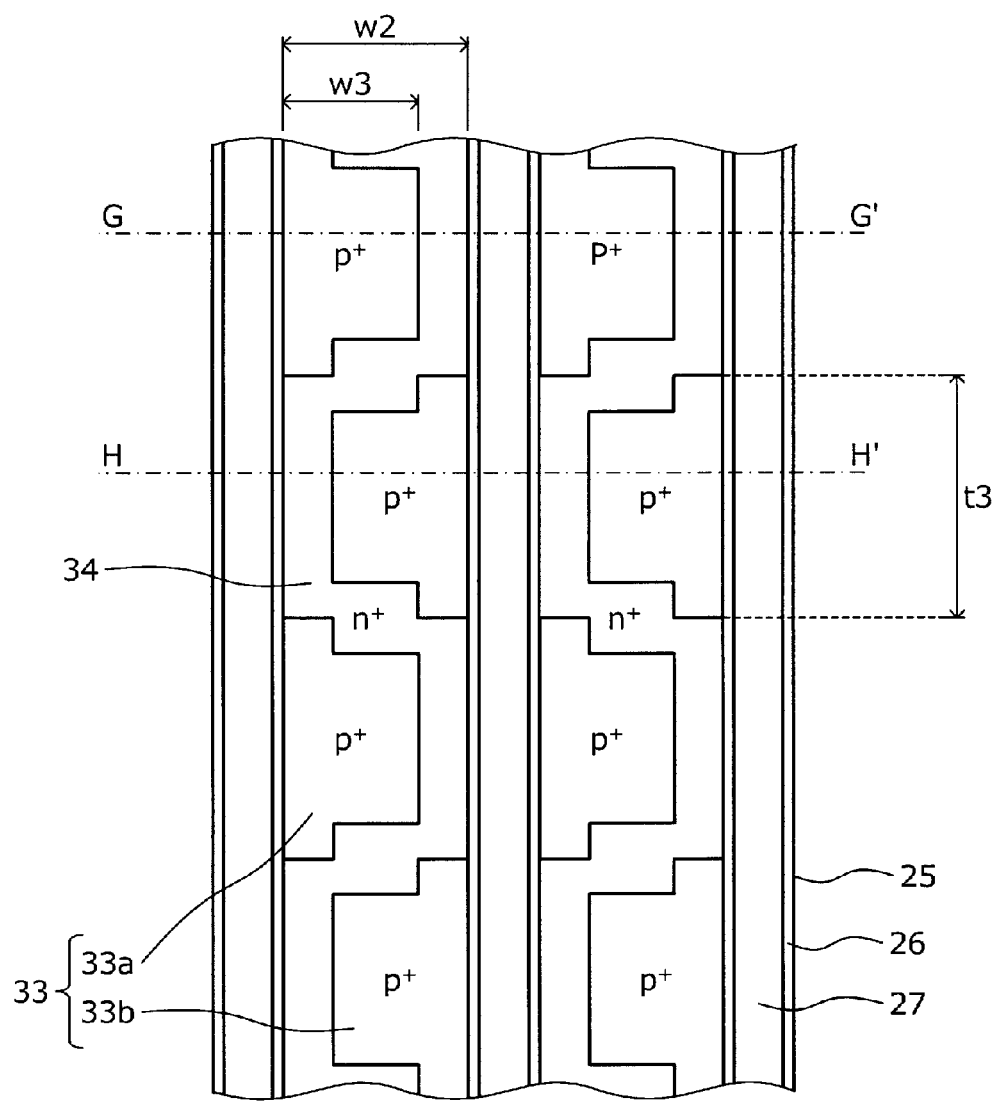
FIG. 10 is a plan view showing a planar layout of a semiconductor device according to a fourth embodiment.
Figure 11:
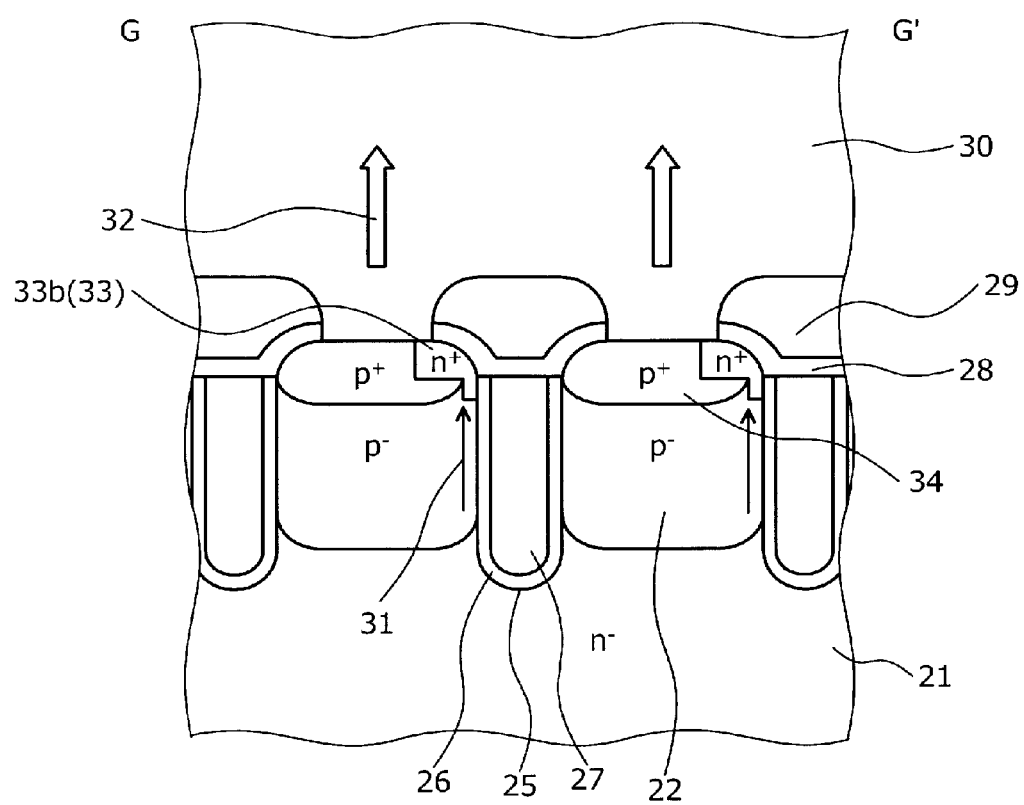
FIG. 11 is a sectional view showing a sectional structure along the section line G-G' of FIG. 10.
Figure 12:
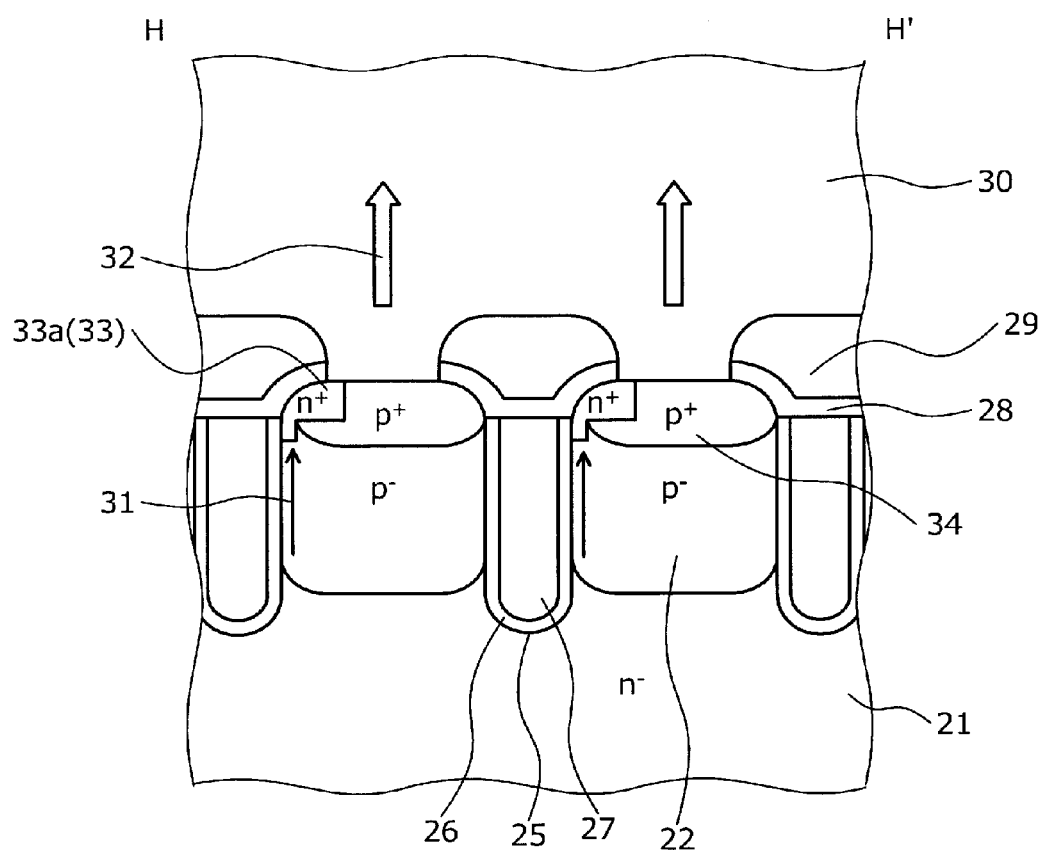
FIG. 12 is a sectional view showing a sectional structure along the section line H-H' of FIG. 10.

Next, a description will be given, as a semiconductor device according to a fourth embodiment, of one example of a structure of unit cells disposed in the active region 2. FIG. 10 is a plan view showing a planar layout of the semiconductor device according to the fourth embodiment. FIG. 11 is a sectional view showing a sectional structure along the section line G-G' of FIG. 10. FIG. 12 is a sectional view showing a sectional structure along the section line H-H' of FIG. 10. The semiconductor device according to the fourth embodiment is different from the semiconductor device according to the second embodiment in that p⁺-type contact regions 33 are selectively disposed so as to make contact alternately in the second direction with the gate insulating films 26 provided on the respective sidewalls of trenches 25 opposed to each other with the mesa portion sandwiched in between.

Specifically, p⁺-type contact regions (hereafter referred to as first p⁺-type contact regions) 33a are selectively disposed at predetermined intervals in the second direction, so as to make contact with the gate insulating film 26, on one (the right sidewall of the trench 25 in the drawing) of the sidewalls of trenches 25 opposed to each other with the mesa portion sandwiched in between. Meanwhile, p⁺-type contact regions (hereafter referred to as second p⁺-type contact regions) 33b are selectively disposed at predetermined intervals in the second direction, so as to make contact with the gate insulating film 26, on the other sidewall (the left sidewall of the trench 25 in the drawing). The second p⁺-type contact regions 33b are disposed apart from the first p⁺-type contact regions 33a. The second p⁺-type contact regions 33b are not opposed to the first p⁺-type contact regions 33a in the first direction with an n⁺-type source region 34 sandwiched in between.

A width (the width of a widest portion) w3 in the first direction of the first p⁺-type contact regions 33a is narrower than a distance w2 between adjacent trenches 25. That is, the first p⁺-type contact regions 33a are not in contact with the gate insulating film 26 provided on the other sidewall, of the sidewalls of trenches 25 opposed to each other with the mesa portion sandwiched in between. The second p⁺-type contact regions 33b are disposed, shifted one from another by a predetermined distance in the second direction, in a planar layout in which one second p⁺-type contact region 33b is axially symmetrical with respect to an adjacent first p⁺-type contact region 33a with a straight line parallel to the first direction as an axis. That is, the second p⁺-type contact regions 33b are not in contact with the gate insulating film 26 provided on the one of the sidewalls of trenches 25 opposed to each other with the mesa portion sandwiched in between. That is, the first p⁺-type contact regions 33a and the second p⁺-type contact regions 33b are disposed alternately in the second direction in the same mesa portion.

Consequently, the first p⁺-type contact regions 33a and the n⁺-type source regions 34 are disposed, alternately in the second direction, in the vicinity of the sidewall of one of trenches 25 opposed to each other with the mesa portion sandwiched in between. The second p⁺-type contact regions 33b and the n⁺-type source regions 34 are disposed, alternately in the second direction, in the vicinity of the sidewall of the other trench. Therefore, the n⁺-type source region 34 is disposed continuously in the second direction in the vicinity of the central portion of the mesa portion. In this way, by the n⁺-type source region 34 being disposed continuously in the second direction, it is possible to cause the current flowing through the semiconductor portion to flow substantially uniformly between unit cells which are adjacent to each other in the second direction. Therefore, as it is possible to make the current, which reaches the front surface electrode from the semiconductor portions, uniform all over the semiconductor element 1, it is possible to cause the current to flow substantially uniformly through the source electrode 30. Also, the first and second p⁺-type contact regions 33a and 33b may have a stepped plan-view shape, one portion of which protrudes into the central portion side of the mesa portion.

In order to adjust the conduction ability of unit cells (the current density in the channels), it is only necessary to variously change a width t3 in the second direction of and the width w3 in the first direction of the first and second p⁺-type contact regions 33a and 33b. For example, the width t3 in the second direction of and the width w3 in the first direction of the first and second p⁺-type contact regions 33a and 33b are variously changed, and the more the area occupied by the first and second p⁺-type contact regions 33a and 33b is increased, the lower the conduction ability can be made. The configurations of the mesa portions are the same, and the first and second p⁺-type contact regions 33a and 33b are each opposed to the n⁺-type source region 34 in the first direction (the horizontal direction in the drawing) with the trench 25 sandwiched in between. An end portion in the second direction of each first p⁺-type contact region 33a may be opposed to an end portion in the second direction of each second p⁺-type contact region 33b with the trench 25 sandwiched in between.

As heretofore described, according to the fourth embodiment, it is possible to obtain the same advantages as in the second and third embodiments.

Embodiment 5

Figure 13:
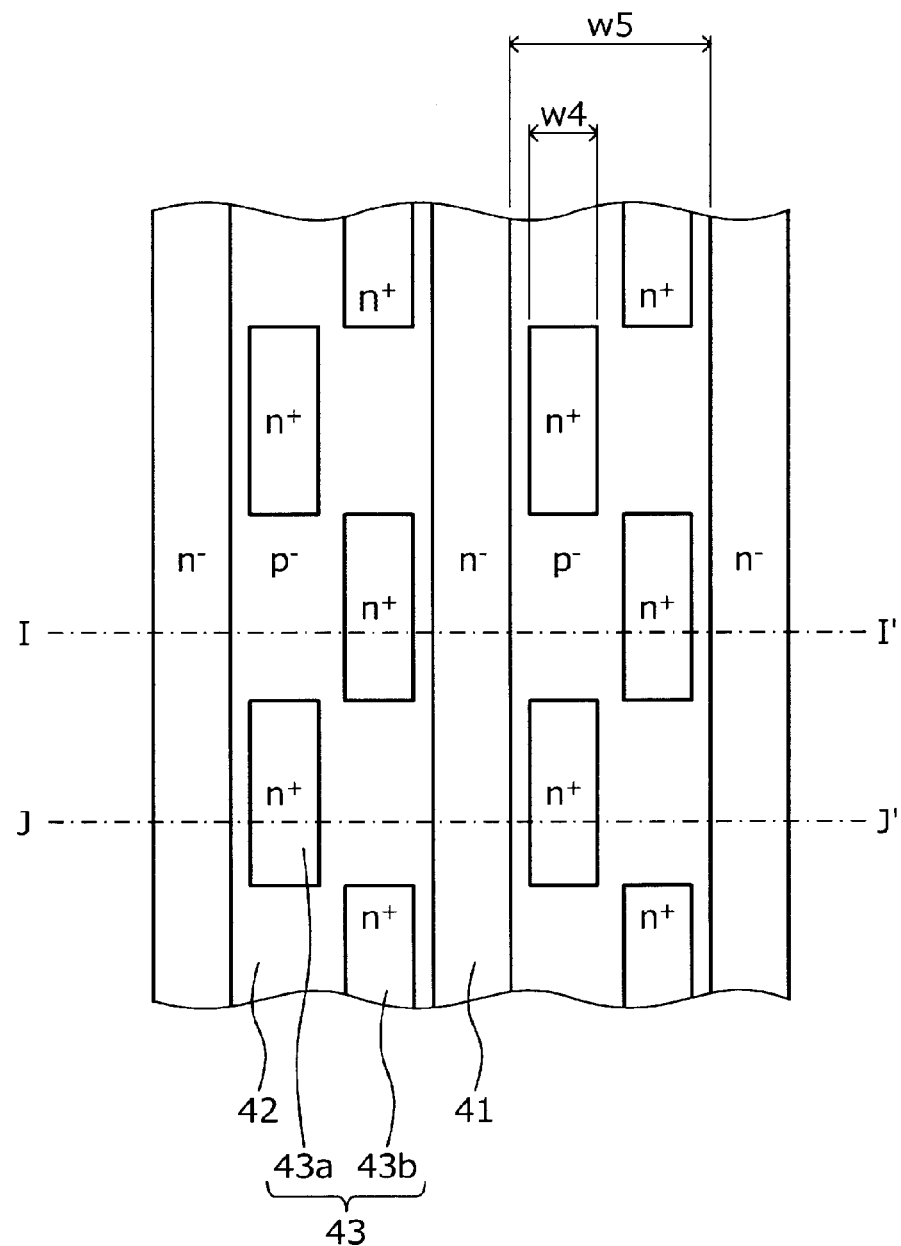
FIG. 13 is a plan view showing a planar layout of a semiconductor device according to a fifth embodiment.
Figure 14:
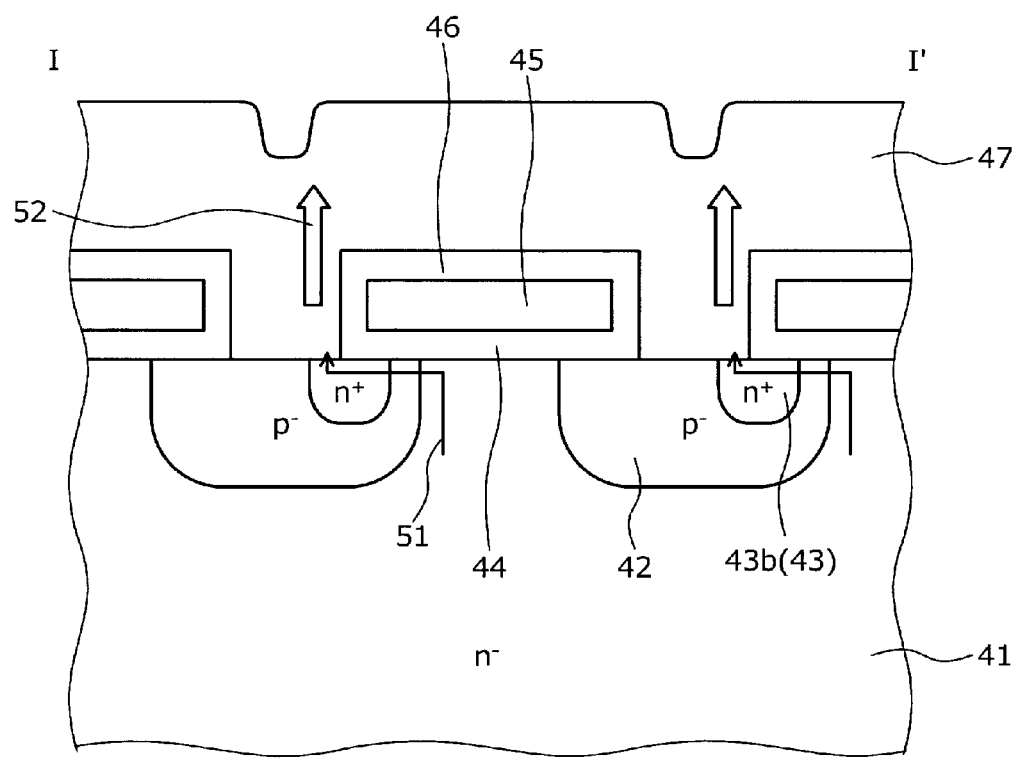
FIG. 14 is a sectional view showing a sectional structure along the section line I-I' of FIG. 13.
Figure 15:
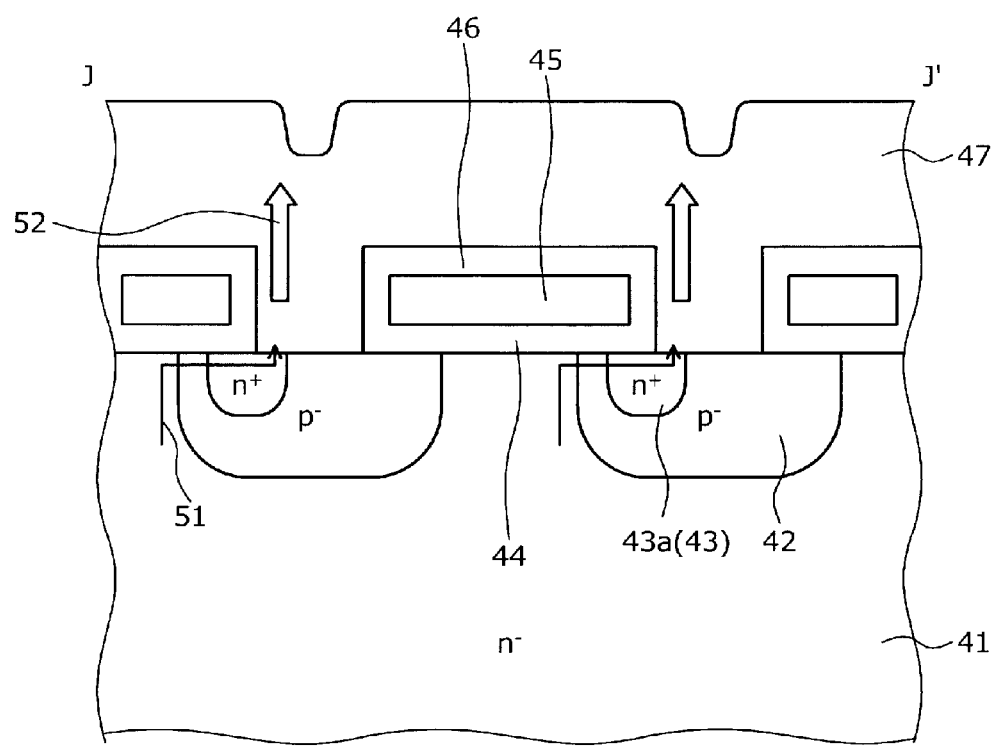
FIG. 15 is a sectional view showing a sectional structure along the section line J-J' of FIG. 13.
Figure 16A:
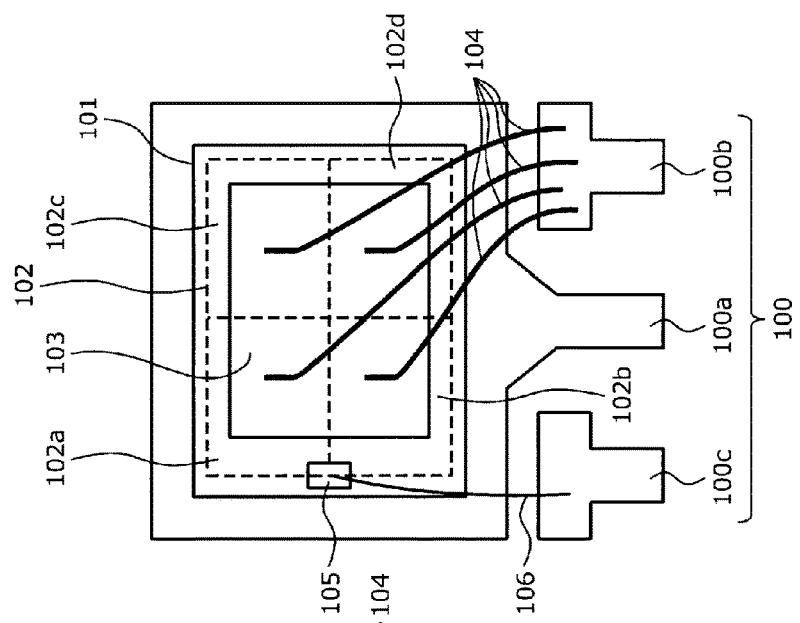
FIGS. 16A to 16C are plan views showing examples of a planar layout of a heretofore known semiconductor device.
Figure 16B:
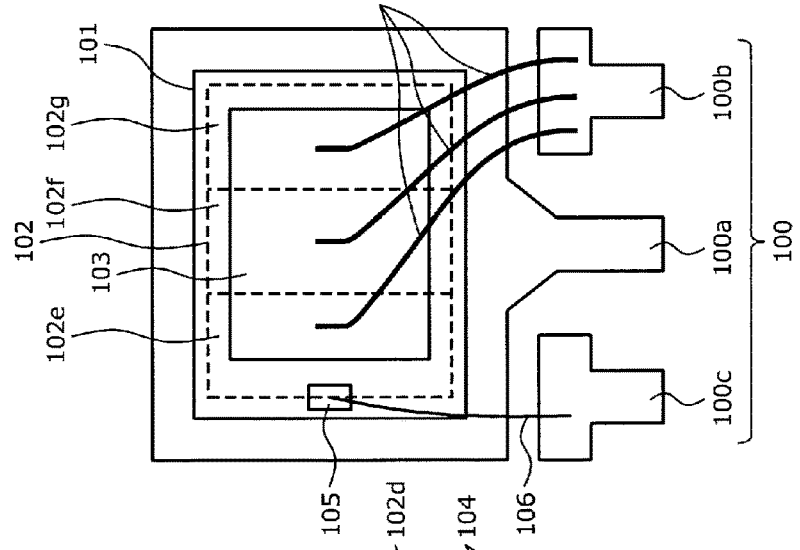
Figure 16C:
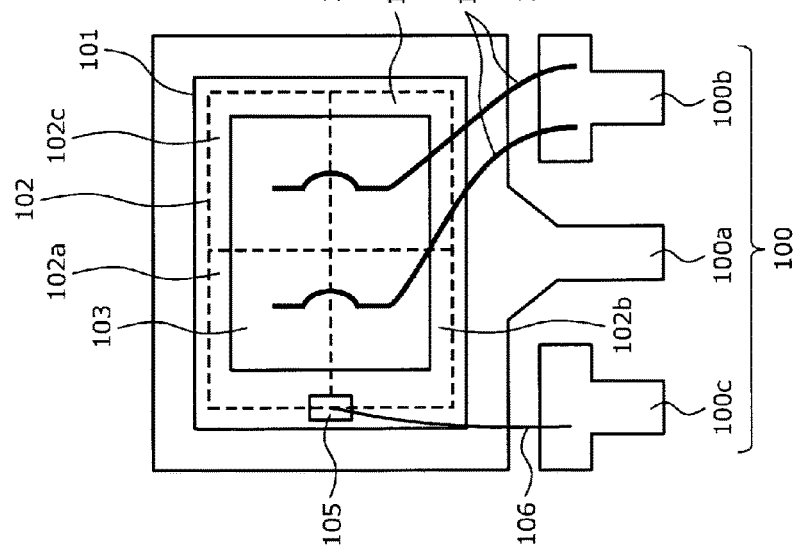
Figure 18:
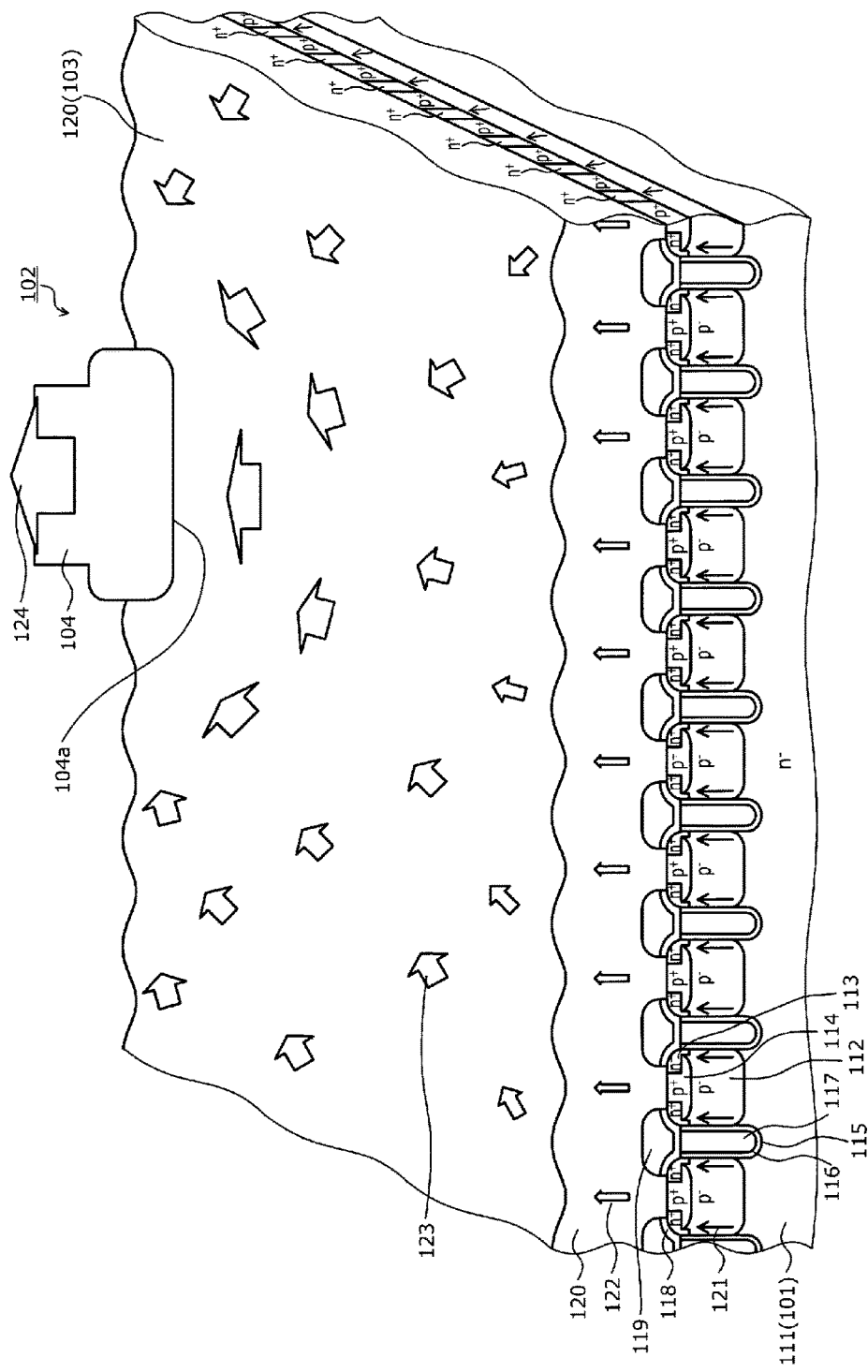
FIG. 18 is an illustration schematically showing a condition wherein a bias is occurring in the size of current flowing through a front surface electrode of a semiconductor element.
Figure 19A:
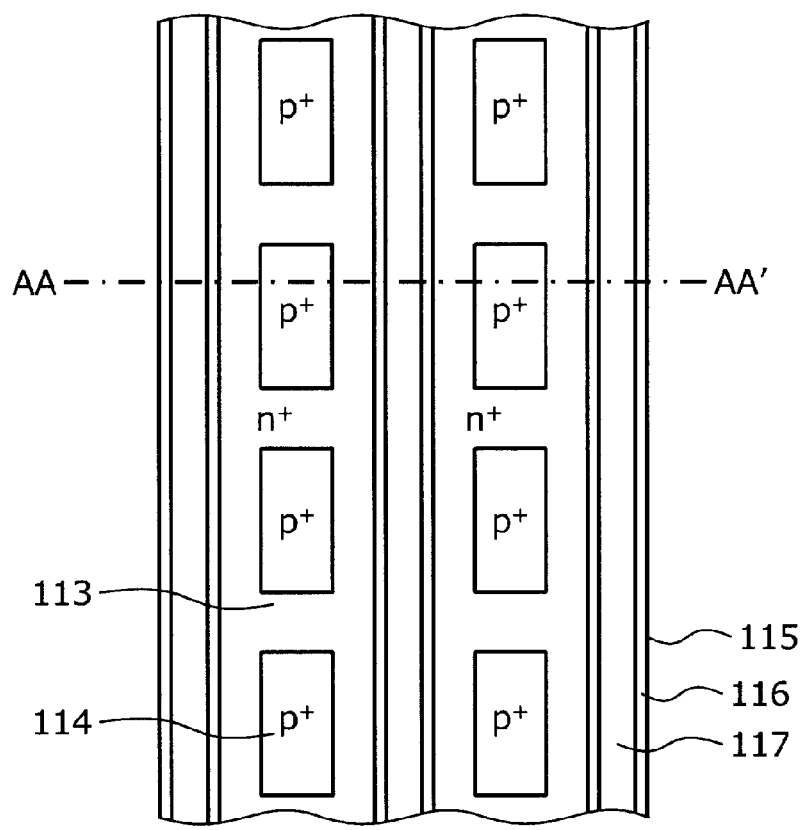
FIGS. 19A and 19B are illustrations showing a structure of unit cells in FIG. 18.
Figure 19B:
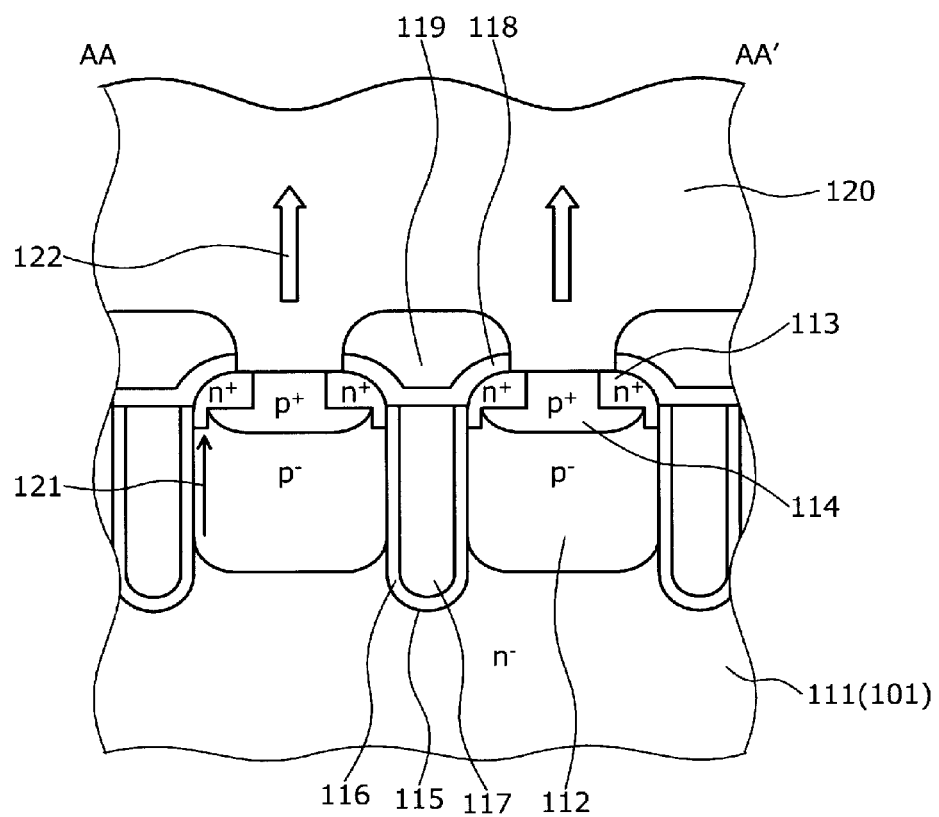
Figure 20:
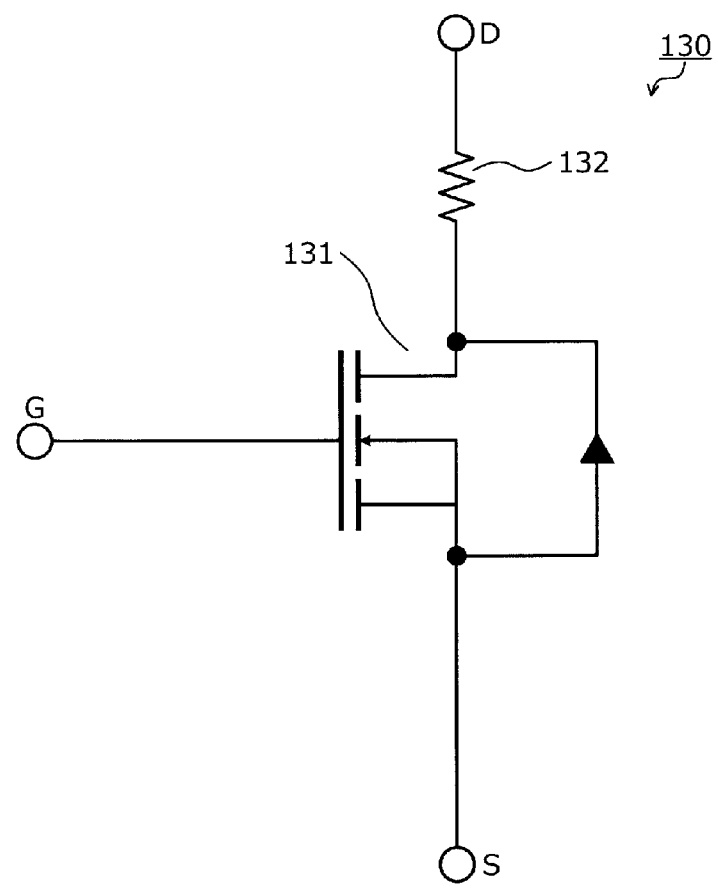
FIG. 20 is a circuit diagram showing a circuit configuration of a heretofore known semiconductor device.

Next, a description will be given, as a semiconductor device according to a fifth embodiment, of one example of a structure of unit cells disposed in the active region 2. FIG. 13 is a plan view showing a planar layout of the semiconductor device according to the fifth embodiment. FIG. 14 is a sectional view showing a sectional structure along the section line I-I' of FIG. 13. FIG. 15 is a sectional view showing a sectional structure along the section line J-J' of FIG. 13. In FIGS. 14 and 15, currents flowing through unit cells when in on-state are shown in order by the arrows identified by signs 51 and 52. The semiconductor device according to the fifth embodiment is one example wherein the semiconductor device according to the fourth embodiment is applied to a planar gate MOSFET. As shown in FIGS. 13 to 15, a planar gate type MOS gate structure is provided on the front surface side of an n⁻-type semiconductor substrate (a semiconductor chip) forming an n⁻-type drift layer 41. The MOS gate structure is formed of, for example, a p⁻-type base region 42, an n⁺-type source region 43, a gate insulating film 44, and a gate electrode 45.

Specifically, the p⁻-type base regions 42 are selectively provided in the substrate front surface (first principal surface) side surface layer of the n⁻-type drift layer 41. The n⁺-type source regions 43 are selectively provided in the substrate front surface side surface layer in the inner portion of the p⁻-type base region 42. The n⁺-type source regions 43 are disposed at predetermined intervals in the second direction. Specifically, n⁺-type source regions (hereafter referred to as first n⁺-type source regions) 43a are selectively provided at predetermined intervals in the second direction on one end portion side (in the left end portions in the drawing) in the first direction of the n⁺-type source regions 43. n⁺-type source regions (hereafter referred to as second n⁺-type source regions) 43b are selectively provided at predetermined intervals in the second direction on the other end portion side (in the right end portions in the drawing) in the first direction of the n⁺-type source regions 43. The first n⁺-type source regions 43a are disposed apart from the second n⁺-type source regions 43b.

The first n⁺-type source regions 43a and the second n⁺-type source regions 43b are disposed alternatively in the second direction in the same mesa portion. That is, the first n⁺-type source regions 43a and the second n⁺-type source regions 43b are disposed so as not to be aligned in the first direction. The first and second n⁺-type source regions 43a and 43b have a substantially rectangular plan-view shape (in FIG. 13, a substantially rectangular plan-view shape elongated in the second direction), and a width w4 in the first direction of the first and second n⁺-type source regions 43a and 43b is narrower than, for example, half of a width w5 in the first direction of the p⁻-type base region 42. Therefore, a portion in which neither of the first and second n⁺-type source regions 43a and 43b is provided exists in the central portion of the p⁻-type base region 42. One portion of each of the first and second n⁺-type source regions 43a and 43b may be formed in a stepped plan-view shape protruded into the central portion side of the p⁻-type base region 42, in the same way as in the fourth embodiment.

Unshown p⁺-type contact regions may be selectively provided in the inner portion of the p⁻-type base region 42. The gate electrode 45 is provided overlapping adjacent p⁻-type base regions 42, via the gate insulating film 44, on the front surfaces of portions, of the adjacent p⁻-type base regions 42, each of which is sandwiched between the n⁻-type drift layer 41 and the n⁺-type source region 43. That is, the gate electrode 45 is also provided, via the gate insulating film 44, on the front surface of a portion (a junction field effect transistor (JFET) region) of the n⁻-type drift layer 41 sandwiched between adjacent p⁻-type base regions 42. An interlayer insulating film 46 is provided on the gate electrode 45. Contact holes through which to expose the p⁻-type base region 42 and n⁺-type source regions 43 are provided passing through the interlayer insulating film 46. The contact holes have a linear plan-view shape extending in the second direction.

A front surface electrode forming a source electrode 47 common to the unit cells is provided substantially all over the active region 2, so as to fill the contact holes, on the interlayer insulating film 46. The source electrode 47 is in contact with the p⁻-type base region 42 and n⁺-type source regions 43 via the contact holes, and is electrically insulated from the gate electrode 45 by the interlayer insulating film 46. A plurality of electrode pads (source electrode pads) 3 are joined to the front surface of the source electrode 47 (not shown in FIGS. 13 to 15, and as for the electrode pads 3, refer to FIGS. 1A to 3). An unshown n⁺-type drain region and drain electrode common to the unit cells are provided all over the substrate rear surface on the substrate rear surface side of the n⁻-type drift layer 41, in the same way as in the fourth embodiment.

As heretofore described, according to the fifth embodiment, it is possible to obtain the same advantages as in the fourth embodiment even when adopting the planar gate type MOS gate structure.

In the above, the invention, not being limited to the heretofore described embodiments, can be variously modified without departing from the scope of the invention. For example, a description is given with a MOSFET as an example, but the invention can also be applied to an IGBT. The invention can be applied even to a semiconductor device wherein a bias in the size of current flowing through a semiconductor element occurs depending on the material of metal plating or wires formed on the front surface of a front surface electrode. Also, in the second to fifth embodiments, a description is given, as an example, of the case of using a diffusion region wherein all the regions configuring the device are formed in the inner portion of the semiconductor substrate, but the invention, not being limited to this, also produces the same advantages when using an epitaxial substrate wherein epitaxial layers are stacked on the semiconductor substrate. Also, in each heretofore described embodiment, a first conductivity type is n-type, and a second conductivity type is p-type, but the invention holds true in the same way even when the first conductivity type is p-type and the second conductivity type is n-type.

As above, the semiconductor device according to the invention is useful for a package type semiconductor device, on which is mounted a semiconductor element (a semiconductor chip) formed of a plurality of unit cells, wherein wire bonding positions on the semiconductor element are not in equal proportions, and in particular, is suitable for a semiconductor device whose semiconductor element is large in current capacity.

What is claimed is:

1. A semiconductor device, comprising:
   a plurality of unit cells provided in a semiconductor substrate, each of the unit cells including an active element through which current flows, the plurality of unit cells including a plurality of first unit cells each having a first conduction ability, a plurality of second unit cells each having a second conduction ability lower than the first conduction ability, and a plurality of third unit cells each having a third conduction ability lower than the first and second conduction abilities;
   a front surface electrode, common to the plurality of unit cells, provided on a front surface of and all over the semiconductor substrate;
   electrode pads, provided closer to an outer peripheral portion side than a central portion of the semiconductor substrate, which are in contact with the front surface electrode and occupy a smaller proportion of a surface area of the semiconductor substrate than the front surface electrode, the electrode pads being aligned along a first direction in a plan view; and
   wires, joined to respective electrode pads at respective junctions thereof, which extract current flowing through the plurality of unit cells to an external location, wherein along a second direction perpendicular to the first direction, the first unit cells, the second unit cells, and the third unit cells are disposed in this order so that the first unit cells are disposed in a vicinity of junctions of the wires and electrode pads, and positions of the third unit cells are farther from the junctions than are positions of the first and second cell units.

2. The semiconductor device according to claim 1, wherein
   the first to third unit cells different in conduction ability are disposed along a path of current flowing through the front surface electrode from the positions apart from the junctions toward the junctions.

3. The semiconductor device according to claim 1, wherein
   the first to third unit cells are disposed so that the farther apart from the junctions, the lower in conduction ability the unit cells are.

4. The semiconductor device according to claim 1, wherein
   the plurality of units are disposed in an active region through which current flows, the active region including first, second and third segments, and
   the first unit cells are disposed in the first segment, the second unit cells are disposed in the second segment, and the third unit cells are disposed in the third segment, the first segment, the second segment, and the third segment being aligned along a path of current flowing through the front surface electrode.

5. The semiconductor device according to claim 1, wherein
   each of the first to third unit cells includes an insulated gate structure formed of a metal oxide film semiconductor, and
   the first to third conduction abilities of the first to third unit cells are set by adjusting a current density in channels.

6. The semiconductor device according to claim 1, wherein
   the unit cells have trenches provided in stripes extending in a direction along a path of current flowing through the front surface electrode, and each unit cell has a trench gate structure wherein a gate electrode is provided in an inner portion of each trench via a gate insulating film.

7. The semiconductor device according to claim 2, wherein
   the first to third unit cells different in conduction ability are disposed so that the farther apart from the junctions, the lower in conduction ability the unit cells are.

8. The semiconductor device according to claim 2, wherein
   the first to third unit cells different in conduction ability are disposed respectively in each of a plurality of segments aligned along a path of current flowing through the front surface electrode.

9. The semiconductor device according to claim 3, wherein
   the unit cells are disposed respectively in each of a plurality of segments aligned along a path of current flowing through the front surface electrode.

10. The semiconductor device according to claim 7, wherein
    the first to third unit cells are disposed respectively in each of a plurality of segments aligned along a path of current flowing through the front surface electrode.

11. The semiconductor device according to claim 3, wherein
    each of the unit cells include an insulated gate structure formed of a metal oxide film semiconductor, and
    the first to third conduction abilities of the first to third unit cells are set by adjusting a current density in channels.

12. The semiconductor device according to claim 4, wherein
    the plurality of unit cells each include an insulated gate structure formed of a metal oxide film semiconductor, and
    the first to third conduction abilities of each of the plurality of unit cells are set by adjusting a current density in channels.

13. The semiconductor device according to claim 3, wherein
    the unit cells have trenches provided in stripes extending in a direction along a path of current flowing through the front surface electrode, and each of the unit cells has a trench gate structure wherein a gate electrode is provided in an inner portion of each trench via a gate insulating film.

14. The semiconductor device according to claim 4, wherein the plurality of unit cells have trenches provided in stripes extending in a direction along a path of current flowing through the front surface electrode, and have trench gate-structures wherein a gate electrode is provided in an inner portion of each trench via a gate insulating film.

15. The semiconductor device according to claim 5, wherein the unit cells have trenches provided in stripes extending in a direction along a path of current flowing through the front surface electrode, and each of the unit cells has a trench gate structure wherein a gate electrode is provided in an inner portion of each trench via a gate insulating film.

16. The semiconductor device of claim 1, wherein source regions of the plurality of unit cells are disposed in a checkered planar layout.

17. The semiconductor device of claim 1, wherein source regions in adjacent mesa portions of the plurality of unit cells are disposed so as not to be opposed to each other.

18. The semiconductor device of claim 14, further comprising a first region in which a first conductivity type region is selectively disposed in a second conductivity type region in the front surface of the semiconductor substrate in the plan view, and a second region in which only second conductivity type region is disposed in the front surface of the semiconductor substrate in the plan view, wherein in the plan view, the first region and the second region are aligned, with sandwiching a corresponding trench gate structure, in a direction perpendicular to the direction of the path of current.

\* \* \* \* \*